(12) United States Patent
Inui et al.

(10) Patent No.: US 11,393,870 B2
(45) Date of Patent: Jul. 19, 2022

(54) PHOTOELECTRIC CONVERSION DEVICE, IMAGING SYSTEM, AND MOBILE APPARATUS

(71) Applicant: CANON KABUSHIKI KAISHA, Tokyo (JP)

(72) Inventors: Fumihiro Inui, Yokohama (JP); Junji Iwata, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 120 days.

(21) Appl. No.: 16/710,177

(22) Filed: Dec. 11, 2019

(65) Prior Publication Data

US 2020/0194491 A1    Jun. 18, 2020

(30) Foreign Application Priority Data

Dec. 18, 2018 (JP) .............................. JP2018-236388
Nov. 29, 2019 (JP) .............................. JP2019-217293

(51) Int. Cl.
*H04N 5/225* (2006.01)
*H01L 27/148* (2006.01)
(Continued)

(52) U.S. Cl.
CPC .......... *H01L 27/14837* (2013.01); *G06T 7/55* (2017.01); *H01L 27/14812* (2013.01);
(Continued)

(58) Field of Classification Search
None
See application file for complete search history.

(56) References Cited

U.S. PATENT DOCUMENTS 7,227,208 B2    6/2007  Ogura
7,561,199 B2    7/2009  Noda
(Continued)

FOREIGN PATENT DOCUMENTS

JP    2018-44923    3/2018
JP    2018-64086    4/2018
(Continued)

OTHER PUBLICATIONS

U.S. Appl. No. 16/780,666, filed Feb. 3, 2020 by Fumihiro Inui et al.

*Primary Examiner* — Twyler L Haskins
*Assistant Examiner* — Dwight Alex C Tejano
(74) *Attorney, Agent, or Firm* — Venable LLP

(57) ABSTRACT

Provided is a photoelectric conversion device including: a pixel including a plurality of photoelectric conversion units; and a select unit configured to control each of the plurality of photoelectric conversion units to be in an active state or an inactive state. The plurality of photoelectric conversion units has a first group including a first avalanche diode and a second group including a second avalanche diode. The select unit controls the second group to be in the inactive state in a first case of controlling the first group to be in the active state, and the select unit controls the first group to be in the inactive state in a second case of controlling the second group to be in the active state. The pixel has no photoelectric conversion unit which is in the active state in both the first case and the second case.

19 Claims, 15 Drawing Sheets

(51) Int. Cl.
*G06T 7/55* (2017.01)
*H04N 5/357* (2011.01)
*H01L 31/107* (2006.01)

(52) U.S. Cl.
CPC ... *H04N 5/357* (2013.01); *G06T 2207/10028* (2013.01); *G06T 2207/30252* (2013.01); *H01L 31/107* (2013.01)

(56) References Cited

U.S. PATENT DOCUMENTS

| | | | |
|---|---|---|---|
| 7,719,587 | B2 | 5/2010 | Ogura |
| 8,259,205 | B2 | 9/2012 | Noda |
| 8,648,944 | B2 | 2/2014 | Iwata |
| 8,697,500 | B2 | 4/2014 | Iwata |
| 8,952,433 | B2 | 2/2015 | Inui |
| 9,538,112 | B2 | 1/2017 | Wada |
| 9,543,340 | B2 | 1/2017 | Iwata |
| 9,979,916 | B2 | 5/2018 | Hiyama |
| 10,121,816 | B2 | 11/2018 | Iwata |
| 10,347,679 | B2 | 7/2019 | Kato |
| 10,424,613 | B2 | 9/2019 | Tsuboi |
| 10,656,251 | B1 * | 5/2020 | Mandai .............. G01J 1/0233 |
| 2011/0136291 | A1 | 6/2011 | Iwata |
| 2014/0340139 | A1 * | 11/2014 | Hirler ................. H03K 17/161 327/504 |
| 2015/0062367 | A1 | 3/2015 | Inui |
| 2017/0242108 | A1 * | 8/2017 | Dussan ................. G01S 7/487 |
| 2018/0081040 | A1 | 3/2018 | Kubota |
| 2018/0108800 | A1 | 4/2018 | Morimoto ......... H01L 31/02005 |
| 2018/0195900 | A1 * | 7/2018 | Delic ................ H01L 27/14609 |
| 2018/0270405 | A1 | 9/2018 | Ota |
| 2018/0374886 | A1 | 12/2018 | Iwata |
| 2019/0191067 | A1 * | 6/2019 | Vaillant .................. H04N 9/045 |
| 2019/0259801 | A1 | 8/2019 | Seto |
| 2019/0259899 | A1 * | 8/2019 | Matsubara ............ G01S 7/4865 |
| 2019/0288149 | A1 * | 9/2019 | Kokubun ......... H01L 31/035281 |
| 2019/0288150 | A1 * | 9/2019 | Miyamoto ......... H04N 5/37455 |
| 2019/0293767 | A1 * | 9/2019 | Kwon ..................... G01S 17/08 |
| 2019/0326450 | A1 | 10/2019 | Iwata |
| 2020/0011732 | A1 * | 1/2020 | Dutton ..................... G01J 1/44 |
| 2020/0018832 | A1 * | 1/2020 | Azuma ............. H01L 31/02027 |
| 2020/0029044 | A1 | 1/2020 | Inui |

FOREIGN PATENT DOCUMENTS

| | | |
|---|---|---|
| JP | 2018-157387 | 10/2018 |
| JP | 2018-530176 | 10/2018 |
| WO | 2017/004663 | 1/2017 |

* cited by examiner

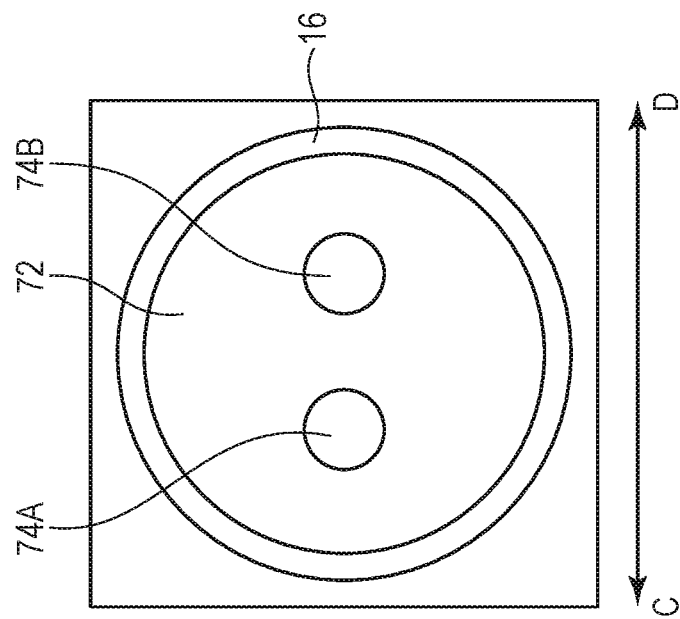
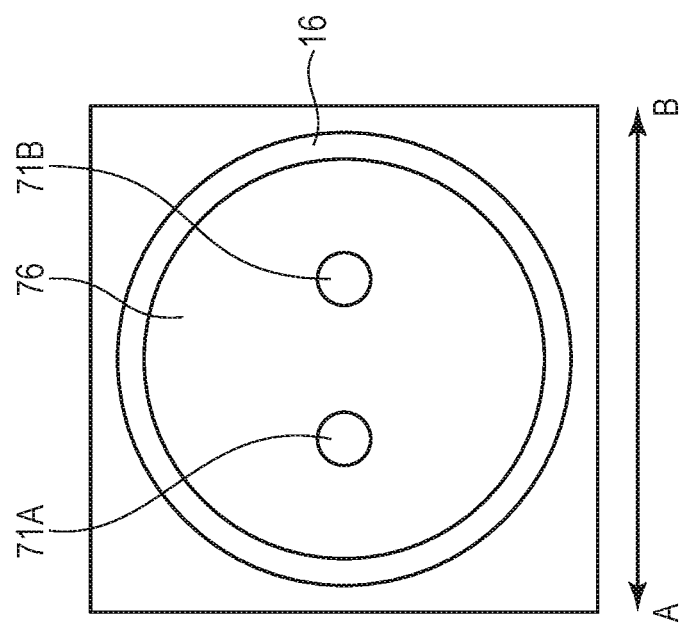

PHOTOELECTRIC CONVERSION DEVICE, IMAGING SYSTEM, AND MOBILE APPARATUS

BACKGROUND OF THE INVENTION

Field of the Invention

The present invention relates to a photoelectric conversion device, an imaging system, and a mobile apparatus.

Description of the Related Art

A Single Photon Avalanche Diode (SPAD) is known as a photo-detection device that can detect a weak light of a single photon level by using avalanche (electronic avalanche) multiplication. Japanese Patent Application Laid-Open No. 2018-64086 discloses a SPAD in which an optical charge due to a single photon causes avalanche multiplication in an intense electric field region of a semiconductor region forming a photo-detection unit.

Further, the SPAD of Japanese Patent Application Laid-Open No. 2018-64086 is configured such that a semiconductor region of a high impurity concentration is arranged in a part of the surface of the semiconductor substrate, and the potential is adjusted so that an intense electric field occurs in the semiconductor region and optical charges generated by an incident light flow into the semiconductor region.

In a photoelectric conversion device using an avalanche diode, the presence of a carrier-capturing level near an intense electric field region may cause a noise current. Such a noise current may cause deterioration of signal quality.

SUMMARY OF THE INVENTION

Accordingly, the present invention intends to provide a photoelectric conversion device that can reduce deterioration of signal quality due to a noise current.

According to one aspect of the present invention, provided is a photoelectric conversion device including: a pixel including a plurality of photoelectric conversion units; and a select unit configured to control each of the plurality of photoelectric conversion units to be in an active state or an inactive state. The plurality of photoelectric conversion units has a first group including a first avalanche diode and a second group including a second avalanche diode. The select unit controls the second group to be in the inactive state in a first case of controlling the first group to be in the active state, and the select unit controls the first group to be in the inactive state in a second case of controlling the second group to be in the active state. The pixel has no photoelectric conversion unit which is in the active state in both the first case and the second case.

Further features of the present invention will become apparent from the following description of exemplary embodiments with reference to the attached drawings.

BRIEF DESCRIPTION OF THE DRAWINGS

FIG. 2A and FIG. 2B are schematic plan views of the avalanche diode according to the first embodiment.

DESCRIPTION OF THE EMBODIMENTS

Preferred embodiments of the present invention will now be described in detail in accordance with the accompanying drawings.

First Embodiment

A photoelectric conversion device according to a first embodiment will be described with reference to FIG. 1 to FIG. 3. The photoelectric conversion device of the present embodiment has one or a plurality of pixels, and each pixel includes a plurality of avalanche diodes. The conductivity type of a charge used as a signal charge of a pair of charges occurring in an avalanche diode is referred to as a first conductivity type. Further, the conductivity type opposite to the first conductivity type is referred to as a second conductivity type.

Figure 1:
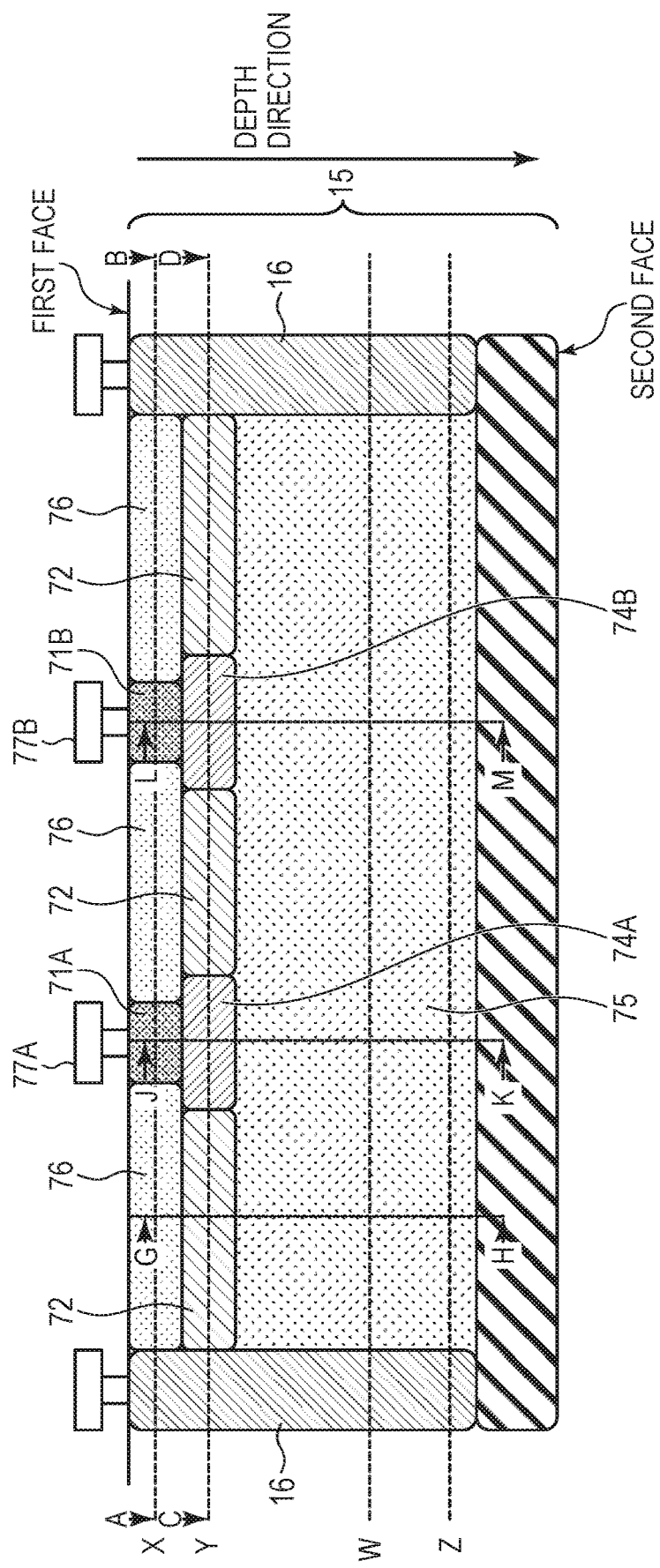
FIG. 1 is a schematic sectional view of an avalanche diode according to a first embodiment.

FIG. 1 is a schematic sectional view of an avalanche diode according to the present embodiment. The avalanche diode of the present embodiment is arranged in a semiconductor substrate 15. The semiconductor substrate 15 has a first face and a second face opposed to the first face. For example, the first face is the front of the semiconductor substrate 15, and the second face is the back of the semiconductor substrate 15. In this specification, a direction from the first face to the second face is referred to as a depth direction. On the front side of the semiconductor substrate 15, a gate electrode of a transistor, a multilayer wiring structure, and the like are arranged.

As illustrated in FIG. 1, a well region surrounded by an isolation portion 16 that functions as an element isolation region is formed in the semiconductor substrate 15. This well region defines a sensitivity region of a pixel. In the well region, first semiconductor regions 71A and 71B, a second semiconductor region 76, and third semiconductor regions 74A and 74B, which are of the first conductivity type, and a fourth semiconductor region 72 and a fifth semiconductor region 75, which are of the second semiconductor type, are arranged. Further, on the first face of the semiconductor substrate 15, a contact plug 77A arranged so as to contact with the first semiconductor region 71A and a contact plug 77B arranged so as to contact with the first semiconductor region 71B are provided. The contact plug 77A functions as a terminal of a first avalanche diode, and the contract plug 77B functions as a terminal of a second avalanche diode.

The first semiconductor regions 71A and 71B and the second semiconductor region 76 are arranged at a first depth X. The first semiconductor region 71A and the second semiconductor region 76 contact with each other in a direction perpendicular to the depth direction (the horizontal direction in FIG. 1). Further, the first semiconductor region 71B and the second semiconductor region 76 also contact with each other in the direction perpendicular to the depth direction. The second semiconductor region 76 is arranged between the first semiconductor region 71A and the isolation portion 16, between the first semiconductor region 71B and the isolation portion 16, and between the first semiconductor region 71A and the first semiconductor region 71B.

Here, the first semiconductor regions 71A and 71B and the second semiconductor region 76 being arranged at the first depth X means that a region where the impurity concentration injected inside the semiconductor substrate 15 is the highest (peak) is at the first depth X, for example. However, this does not mean that the peak matches the first depth X in a strict sense, and a case where the peak is shifted from the first depth X due to a design error, a manufacturing error, or the like is also included in a state where the peak is arranged at the first depth X.

The third semiconductor regions 74A and 74B and the fourth semiconductor region 72 are arranged at a second depth Y that is deeper than the first depth X with respect to the first face. The third semiconductor region 74A and the fourth semiconductor region 72 contact with each other in the direction perpendicular to the depth direction. Further, the third semiconductor region 74B and the fourth semiconductor region 72 also contact with each other in the direction perpendicular to the depth direction. The fourth semiconductor region 72 is arranged between the third semiconductor region 74A and the isolation portion 16, between the third semiconductor region 74B and the isolation portion 16, and between the third semiconductor region 74A and the third semiconductor region 74B, respectively, at the second depth Y. The fifth semiconductor region 75 is arranged at a third depth Z that is deeper than the second depth Y with respect to the first face.

FIG. 2A and FIG. 2B are schematic plan views of the avalanche diode according to the present embodiment. FIG. 2A is a schematic plan view of an avalanche diode at the first depth X, and FIG. 2B is a schematic plan view of an avalanche diode at the second depth Y.

As illustrated in FIG. 2A, at the first depth X, the first semiconductor regions 71A and 71B are included inside the second semiconductor region 76. Further, the first semiconductor region 71A and the first semiconductor region 71B do not overlap each other. Further, the second semiconductor region 76 is included inside the isolation portion 16.

As illustrated in FIG. 2B, at the second depth Y, the third semiconductor regions 74A and 74B are included inside the fourth semiconductor region 72. Further, the third semiconductor region 74A and the third semiconductor region 74B do not overlap each other. Further, the fourth semiconductor region 72 is included inside the isolation portion 16. As illustrated in FIG. 1, FIG. 2A, and FIG. 2B, in a plan view, the first semiconductor region 71A overlaps at least a part of the third semiconductor region 74A. Further, in the plan view, the first semiconductor region 71B overlaps at least a part of the third semiconductor region 74B. Further, in the plan view, the third semiconductor regions 74A and 74B and the fourth semiconductor region 72 overlap the fifth semiconductor region 75. Further, in the plan view, the second semiconductor region 76 overlaps at least a part of the fourth semiconductor region 72.

Figure 3:
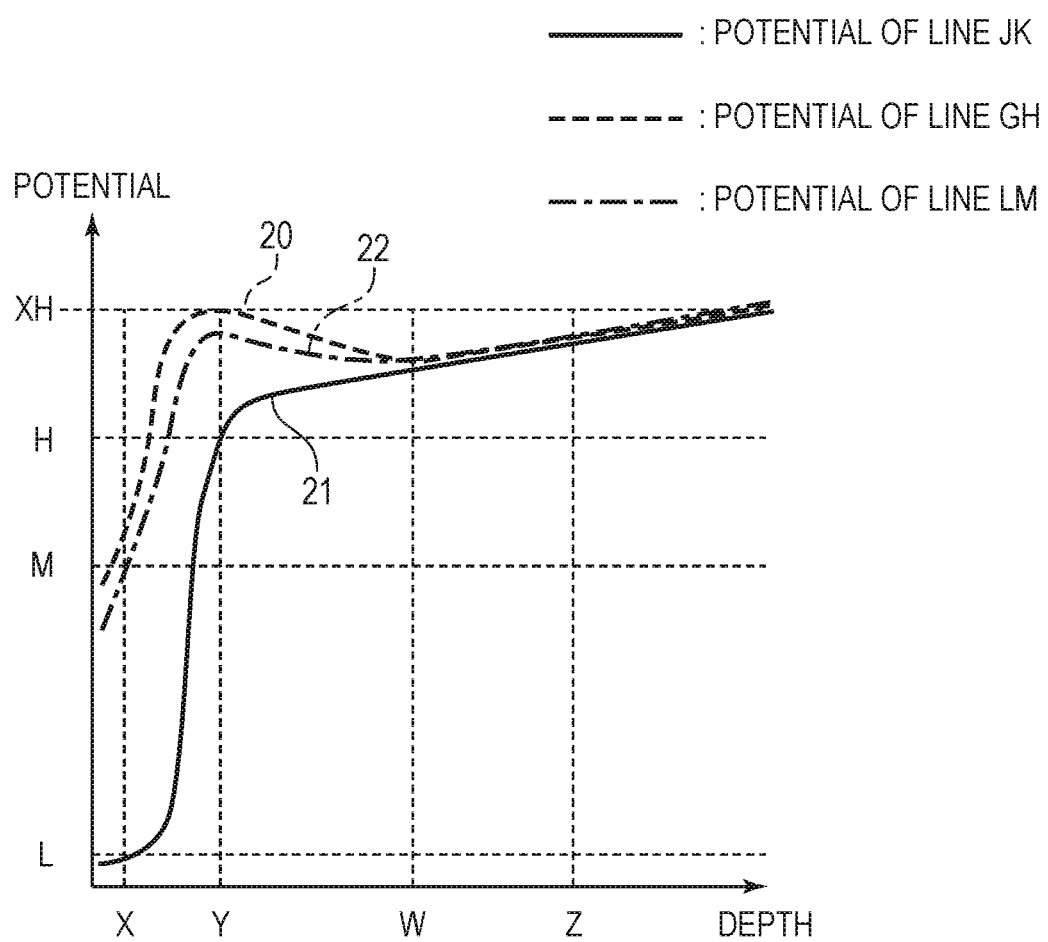
FIG. 3 is a potential diagram of the avalanche diode according to the first embodiment.

FIG. 3 is a graph illustrating one example of the potential of the avalanche diode according to the present embodiment. FIG. 3 illustrates potential distributions along a line JK, a line GH, and a line LM of the sectional view illustrated in FIG. 1. The potential inside the semiconductor region changes in accordance with the electric potential applied to the contact plugs 77A and 77B. The potential illustrated in FIG. 3 is a potential when an electric potential is supplied so that a reverse bias voltage is applied to only the first avalanche diode associated with the contact plug 77A. This electric potential is supplied from a power source voltage line provided outside the avalanche diode via a circuit such as a quench circuit. Further, the level of the electric potential is set so that avalanche multiplication occurs in the first avalanche diode. In contrast, such an electric potential that causes a floating state or provides a bias voltage near a zero bias is supplied to the second avalanche diode associated with the contact plug 77B.

The dashed line 20 indicates the potential distribution along the line GH, the solid line 21 indicates the potential distribution along the line JK, and the one-dot chain line 22 indicates the potential distribution along the line LM. Each of these potentials indicates a potential for an electron that is a signal charge. Note that, when a signal charge is a hole, the height relationship of the potentials is opposite. The depths X, Y, Z, and W correspond to the depths of the positions labeled with the corresponding references illustrated in FIG. 1. That is, the depths X, Y, and Z are the first depth X, the second depth Y, and the third depth Z described above, respectively. Further, the depth W is a depth between the second depth Y and the third depth Z.

Respective levels of the potentials in FIG. 3 will be described. The XH level indicates the potential of the fourth semiconductor region 72. The H level indicates the potential of the third semiconductor region 74A. The M level indicates the potential of the second semiconductor region 76. The L level indicates the potential of the first semiconductor region 71A. Note that, while it is indicated that the potential of the second semiconductor region 76 is lower than the potential of the third semiconductor region 74A, this may be opposite.

The potential of the third semiconductor region 74B is between the XH level and the H level. The potential of the first semiconductor region 71B is between the M level and the L level. Note that, while it is indicated that the potential of the third semiconductor region 74B is lower than the potential of the fourth semiconductor region 72, these potentials may be the same. Further, while it is indicated that the potential of the first semiconductor region 71B is lower than the potential of the second semiconductor region 76, these potentials may be the same.

The potential along the line GH indicated by the dashed line 20 will be described. At the depth Z, the potential is between the XH level and the H level. The potential gradually decreases along the depth Z toward the depth W. Further, the potential gradually increases along the depth W toward the depth Y and reaches the XH level at the depth Y. Furthermore, the potential gradually decreases along the depth Y toward the depth X. The potential is the M level near the depth X.

The potential along the line JK indicated by the solid line 21 passing through the first avalanche diode will be described. At the depth Z, the potential is between the XH level and the H level. The potential gradually decreases along the depth Z toward the depth Y, and the slope of the potential increases near the depth Y. The potential is the H level at the depth Y. The potential sharply decreases along the depth Y toward the depth X. That is, a steep potential gradient is formed between the depth Y and the depth X. At the depth X, the potential is the L level.

The potential along the line LM indicated by the one-dot chain line 22 passing through the second avalanche diode will be described. At the depth Z, the potential is between the XH level and the H level. The potential gradually decreases along the depth Z toward the depth W. Further, the potential gradually increases along the depth W toward the depth Y and is a level between the XH level and the H level at the depth Y. Furthermore, the potential gradually decreases along the depth Y toward the depth X. At the depth X, the potential is a level between the M level and the L level. The difference in the potential distribution at positions of these lines is caused by a difference of the electric potential applied to the two avalanche diode.

At the depth Z, the potentials on the line GH, the line JK, and the line LM are substantially the same. Further, near the depth Z, a potential gradient that gently decreases toward the first face side of the semiconductor substrate 15 is formed at each position of the line GH, the line JK, and the line LM. Thus, charges generated in a semiconductor region within a pixel by an incident light move toward the first face side in accordance with this potential gradient.

On the line JK, the potential gradient that gently degreases toward the first face side of the semiconductor substrate 15 is formed as approaching to the depth Y from the depth W. Thereby, charges move toward the first face side. On the other hand, on the line GH and the line LM, a potential gradient that gently increases toward the first face side of the semiconductor substrate 15 is formed as approaching to the depth Y from the depth W. This potential gradient is a potential barrier against a charge toward the first face. That is, the fourth semiconductor region 72 and the third semiconductor region 74B function as a potential barrier that suppresses a charge from moving from the fifth semiconductor region 75 to the second semiconductor region 76. In contrast, since the potential gradient in the horizontal direction from each position of the line GH and the line LM to the line JK is small, this causes a charge present near the line GH and the line LM within the range from the depth W to the depth Y to easily move to a part near the line JK in a course of motion toward the first face.

A charge that has moved to a part near the region indicated by the line JK is accelerated by a steep potential gradient formed over a range from the depth Y to the depth X, that is, by an intense electric field. A charge accelerated by the intense electric field reaches the first semiconductor region 71A. In such a way, avalanche multiplication occurs in a region from the depth Y to the depth X near the line JK. In contrast, the regions indicated by the line GH and the line LM have a potential distribution by which avalanche multiplication is less likely to occur than in a region from the depth Y to the depth X on the line JK. That is, in a period in which one of the avalanche diodes is controlled so as to cause avalanche multiplication, the other avalanche diode is controlled so as to be less likely to cause avalanche multiplication.

One example that realizes the above structure is provided as below. The difference between the potential of the first semiconductor region 71A and the potential of the third semiconductor region 74A is set to be larger than the difference between the potential of the second semiconductor region 76 and the potential of the fourth semiconductor region 72. Further, the difference between the potential of the first semiconductor region 71A and the potential of the third semiconductor region 74A is set to be larger than the difference between the potential of the first semiconductor region 71B and the potential of the third semiconductor region 74B. With such potential structure, a configuration in which avalanche multiplication occurs in only one of the two avalanche diodes arranged in a pixel is realized. Thereby, while avalanche multiplication does not occur in the other avalanche diode, resulted reduction in sensitivity is reduced by the following configuration.

In the present embodiment, two avalanche diodes are formed in the same well region surrounded by an element isolation region. Further, the potential of the third semiconductor region 74A is lower than the potential of the fourth semiconductor region 72 and the third semiconductor region 74B. Thus, the fourth semiconductor region 72 and the third semiconductor region 74B function as a potential barrier against a signal charge present in the fifth semiconductor region 75. This causes a signal charge present in a region of the fifth semiconductor region 75 overlapping the fourth semiconductor region 72 or the third semiconductor region 74B to easily move to the first semiconductor region 71A via the third semiconductor region 74A. Therefore, since charges are collected to one of the avalanche diodes in which avalanche multiplication occurs, reduction in sensitivity described above is reduced.

FIG. 3 illustrates the potential structure when the third semiconductor regions 74A and 74B are P-type semiconductor regions. Even when the third semiconductor regions 74A and 74B are N-type semiconductor regions, however, the relationship of the potentials at the depth Y does not change for the line GH, the line JK, and the line LM, respectively. That is, at the depth Y, the potential on the line GH and the line LM is higher than the potential of the line JK.

Further, while FIG. 3 illustrates the potential structure when the second semiconductor region 76 is an N-type semiconductor region, the relationship of the potentials at the depth Y does not change for the line GH, the line JK, and the line LM, respectively, even when the second semiconductor region 76 is a P-type semiconductor region. That is, at the depth Y, the potentials on the line GH and the line LM are higher than the potential of the line JK.

Note that it is desirable that the whole region of the first semiconductor region 71A overlap the third semiconductor region 74A in a plan view. Further, it is desirable that the whole region of the first semiconductor region 71B overlap the third semiconductor region 74B in a plan view. In other words, it is desirable that the first semiconductor regions 71A and 71B do not overlap the fourth semiconductor region 72 in a plan view. According to such a configuration, no PN junction is formed between the first semiconductor regions 71A and 71B and the fourth semiconductor region 72. If PN junction is present between the first semiconductor regions 71A and 71B and the fourth semiconductor region 72, avalanche multiplication may occur at the PN junction, and noise may occur due to a tunneling effect. By employing the structure in which the first semiconductor regions 71A and 71B and the fourth semiconductor region 72 do not overlap each other, it is possible to suppress noise due to the mechanism described above.

In the above description, an electric potential is supplied so that an electric potential of a reverse bias is applied to only the first avalanche diode associated with the contact plug 77A. Further, the second avalanche diode associated with the contact plug 77B is supplied with an electric potential near a zero bias or caused to be in a floating state. However, the relationship of the supplied electric potentials may be exchanged between the contact plug 77A and the contact plug 77B. That is, a select unit that switches a supplied electric potential may be provided so that the avalanche diode that causes avalanche multiplication is selectable.

In such a case, in FIG. 3, the dashed line 20 indicates a potential distribution on the line GH, the solid line 21 indicates a potential distribution on the line LM, and the one-dot chain line 22 indicates a potential distribution on the line JK. That is, the potential distribution of the line LM and the potential distribution of the line JK are replaced with each other. Therefore, by changing the electric potentials to be applied to the contact plugs 77A and 77B, the region where avalanche multiplication occurs can be switched from the first semiconductor region 71A to the first semiconductor region 71B.

Next, a noise current that may occur in an intense electric field region will be described. It is known that a noise current caused by a carrier-capturing level due to a heavy metal or the like is larger when both an electric carrier density n and a hole carrier density p nearby are smaller than an intrinsic carrier density ni (that is, $n<ni$ and $p<ni$). Such a state where both the electron carrier density n and the hold carrier density p are small is a state that can be found in a depletion layer in which carriers are removed by an intense electric field or the like. Further, it is also known that, since a nearby potential displacement is large in an intense electric field region, an apparent bandgap becomes smaller, and a noise current due to a tunneling effect becomes larger.

For the reason described above, when a carrier-capturing level due to a heavy metal or the like exists near the intense electric field region of the first semiconductor region 71A or 71B, a relatively large noise current may occur. Such a carrier-capturing level due to the heavy metal or the like may occur at random at a certain probability when the photoelectric conversion device is manufactured.

The photoelectric conversion device of the present embodiment can reduce the occurrence probability of a noise current occurring due to the factor described above. First, after the photoelectric conversion device of the present embodiment is manufactured, one of the first avalanche diode and the second avalanche diode which has the smaller noise current is determined. Then, the electric potential to be supplied to the contact plug 77A or the contact plug 77B is set so that avalanche multiplication occurs in the avalanche diode which has the smaller noise current within a pixel, and a reverse bias voltage is supplied. Further, for the avalanche diode which has the larger noise current, the electric potential is controlled so as to have a floating state or a zero bias state to prevent avalanche multiplication from occurring. Thereby, performance deterioration due to a noise current can be reduced.

As described above, the photoelectric conversion device of the present embodiment has a plurality of avalanche diodes, and the avalanche diode with a small noise current can be selected. Accordingly, a photoelectric conversion device that can reduce deterioration of signal quality due to a noise current can be provided.

Note that, when the photoelectric conversion device further has a microlens array having a plurality of microlenses, one microlens is arranged for one pixel. From a different viewpoint, it can be said that a region corresponding to one microlens is a region of one pixel. A light that has passed through the microlens will enters a plurality of avalanche diodes provided to one pixel. Note that the photoelectric conversion device of the present embodiment may be any of a configuration of a so-called front irradiation type in which microlenses are provided on the first face side of the semiconductor substrate 15 of FIG. 1 or a configuration of a so-called back irradiation type in which microlenses are provided on the second face side.

Further, it has been described that an element isolation region that electrically isolates the pixels from each other is provided between the pixels. Such an element isolation region may be an insulating isolation region made by Local Oxidation Of Silicon (LOCOS), Shallow Trench Isolation (STI), Deep Trench Isolation (DTI), or the like. Further, the element isolation region may be a PN isolation region by using PN junction between a P-type semiconductor region and an N-type semiconductor region.

Second Embodiment

Figure 4:
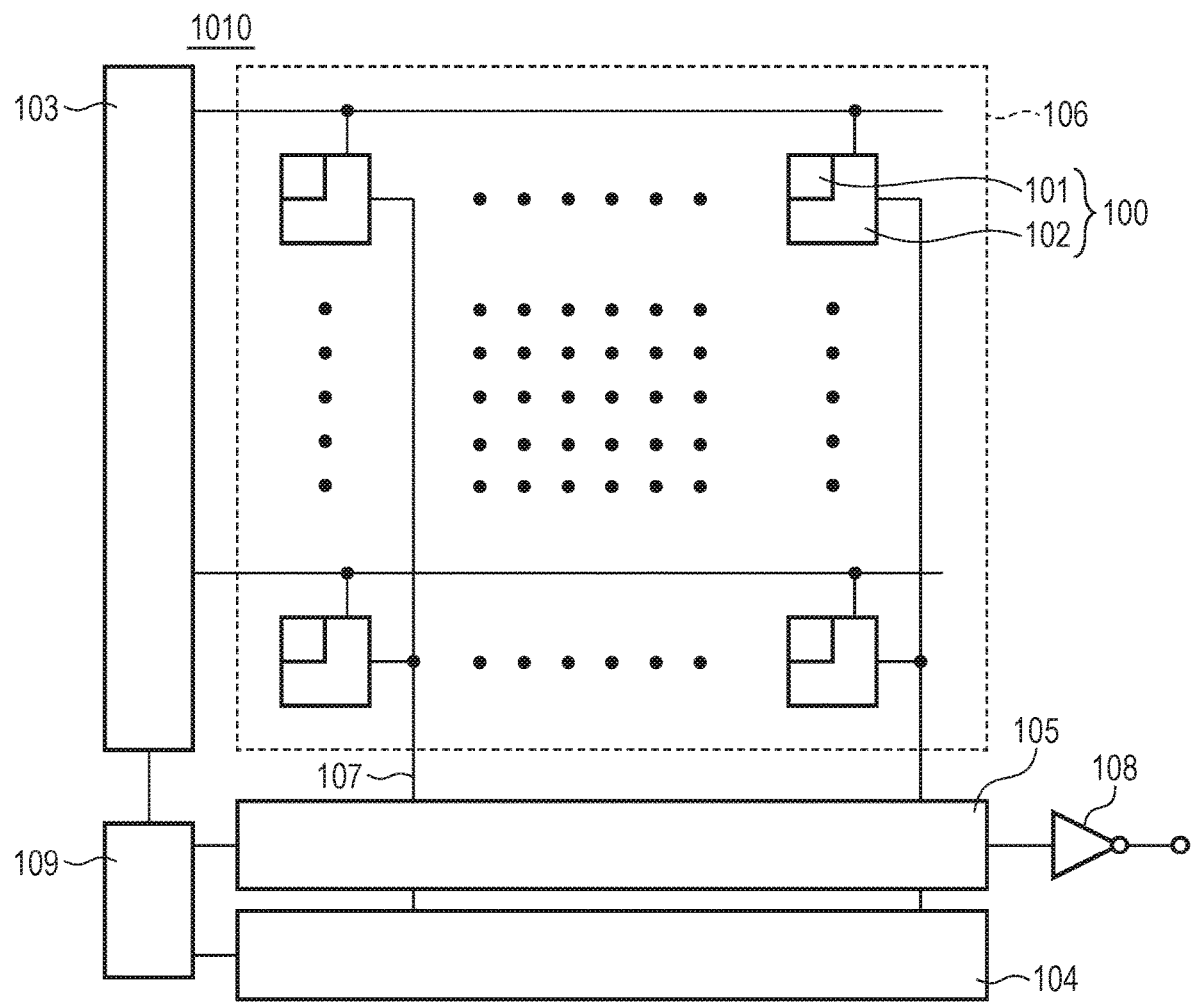
FIG. 4 is a block diagram of a photoelectric conversion device according to a second embodiment.

A photoelectric conversion device according to a second embodiment will be described with reference to FIG. 4 to FIG. 8. A component having the same function as that of the first embodiment is labeled with the same reference, and detailed description thereof will be omitted. FIG. 4 is a block diagram of a photoelectric conversion device 1010 according to the present embodiment. The photoelectric conversion device 1010 has a pixel unit 106, a control pulse generation unit 109, a horizontal scanning circuit 104, a column circuit 105, signal lines 107, an output circuit 108, and a vertical scanning circuit 103.

The pixel unit 106 has a plurality of pixels 100 arranged to form a plurality of rows and a plurality of columns. Each of the pixels 100 includes a photoelectric conversion element 101 and a pixel signal processing unit 102. The photoelectric conversion element 101 converts a light entering the photoelectric conversion device 1010 into an electric signal. The pixel signal processing unit 102 outputs the converted electric signal to the column circuit 105 via the signal line 107.

The vertical scanning circuit 103 supplies control pulses used for driving respective pixels 100 on a pixel row basis based on control pulses supplied from the control pulse generation unit 109. A logic circuit such as a shift register, an address decoder, or the like may be used for the vertical scanning circuit 103. The signal lines 107 are arranged on each column of the pixel unit 106. The signal line 107 transmits, to the column circuit 105, a signal output from the pixel 100 selected by the vertical scanning circuit 103.

Signals from respective pixels 100 are input to the column circuit 105 via the signal lines 107 on respective columns of the pixel unit 106, and a predetermined process is performed thereon. The predetermined process may include a process of noise removal, amplification, or the like of an input signal and a process of converting a processed signal into a form that can be externally output. To realize this function, the column circuit 105 has a parallel-to-serial converter circuit, for example.

The horizontal scanning circuit 104 supplies, to the column circuit 105, control pulses used for outputting a signal processed by the column circuit 105 to the output circuit 108 sequentially on a column basis.

The output circuit 108 is formed of a buffer amplifier, a differential amplifier, or the like. The output circuit 108 outputs a signal output from the column circuit 105 to a storage unit or a signal processing unit of an apparatus outside the photoelectric conversion device 1010.

In FIG. 4, while the arrangement of the pixels 100 in the pixel unit 106 is two-dimensional matrix, the arrangement is not limited thereto. For example, the pixel unit 106 may be arranged such that a plurality of pixels 100 is aligned one-dimensionally. Further, only a single pixel 100 may be included in the pixel unit 106. Further, the vertical scanning circuit 103, the horizontal scanning circuit 104, and the column circuit 105 may be divided into a plurality of blocks. Further, the plurality of pixels 100 of the pixel unit 106 may be divided into a plurality of blocks, and the blocks of the pixel unit 106 may be arranged to correspond to the blocks of the vertical scanning circuit 103, the horizontal scanning circuit 104, and the column circuit 105 described above. Further, the horizontal scanning circuit 104 and the column circuit 105 may be divided into blocks corresponding to the pixel columns.

It is not essential that the function of the pixel signal processing unit 102 be provided one by one in all the pixels 100 within the pixel unit 106, and one pixel signal processing unit 102 may be shared by a plurality of pixels 100, for example. In such a case, the pixel signal processing unit 102 sequentially performs processing on signals output from the plurality of pixels 100.

Further, the pixel signal processing units 102 may be provided on a semiconductor substrate that is different from the semiconductor substrate 15 on which the photoelectric conversion elements 101 are formed. This can increase the ratio of the area of the photoelectric conversion elements 101 relative to the chip area and improve sensitivity of the photoelectric conversion elements 101. In such a case, the photoelectric conversion element 101 and the pixel signal processing unit 102 are electrically connected to each other via a connection wiring provided for each pixel 100. Similarly, the vertical scanning circuit 103, the horizontal scanning circuit 104, the signal lines 107, and the column circuit 105 may also be provided on a semiconductor substrate that is different from the substrate for the photoelectric conversion elements 101, and the same advantage is obtained.

Figure 5:
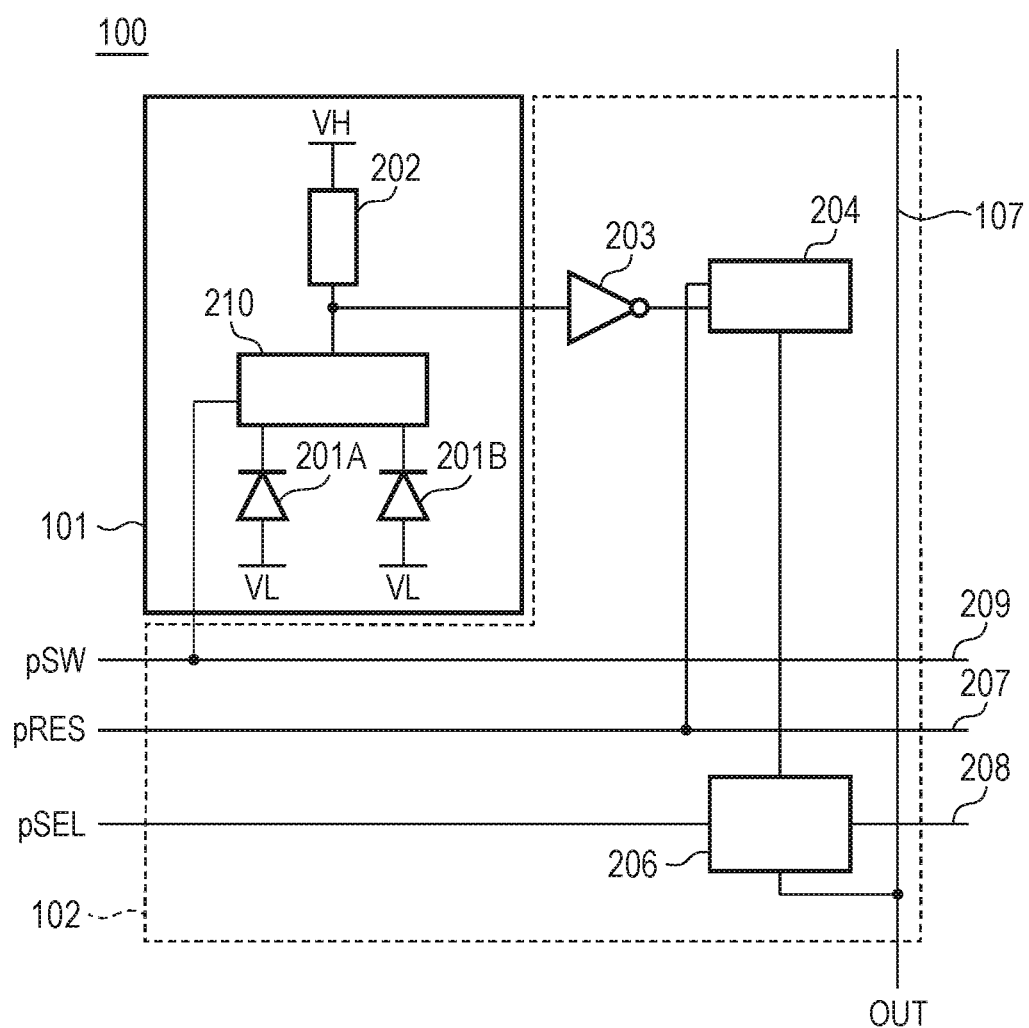
FIG. 5 is a block diagram of a pixel according to the second embodiment.

FIG. 5 is one example of a block diagram of the pixel 100 in the present embodiment. In FIG. 5, a single pixel 100 has a photoelectric conversion element 101 and the pixel signal processing unit 102. The photoelectric conversion element 101 has two photoelectric conversion units 201A and 201B, a control unit 202, and a selector circuit 210.

The photoelectric conversion units 201A and 201B generate a pair of charges in accordance with an incident light by photoelectric conversion. The photoelectric conversion units 201A and 201B correspond to the first avalanche diode and the second avalanche diode described in the first embodiment, respectively. The anodes of the photoelectric conversion units 201A and 201B are connected to an electric potential line that supplies an electric potential VL. The cathodes of the photoelectric conversion units 201A and 201B are connected to the selector circuit 210.

A control pulse pSW is input to the selector circuit 210 from the vertical scanning circuit 103 via a drive line 209. The selector circuit 210 selects either one of the photoelectric conversion units 201A and 201B based on the control pulse pSW and connects the selected one to the control unit 202. The selector circuit 210 may be a switch circuit in which the connection state changes in accordance with the signal level of the control pulse pSW, for example. As one example, the control pulse pSW is a high level signal or a low level signal corresponding to a value of 0 or a value of 1, respectively, the value 0 corresponds to a signal to select the photoelectric conversion unit 201A, and the value 1 corresponds to a signal to select the photoelectric conversion unit 201B. When the control pulse pSW is 0, the selector circuit 210 connects the cathode of the photoelectric conversion unit 201A to the control unit 202 and does not connect the cathode of the photoelectric conversion unit 201B to the control unit 202. On the other hand, when the control pulse pSW is 1, the selector circuit 210 connects the cathode of the photoelectric conversion unit 201B to the control unit 202 and does not connect the cathode of the photoelectric conversion unit 201A to the control unit 202.

The cathode of the photoelectric conversion unit selected by the selector circuit 210 (the photoelectric conversion unit 201A or the photoelectric conversion unit 201B) is supplied with an electric potential based on an electric potential VH that is higher than the electric potential VL. A reverse bias is applied to the anode and the cathode of the photoelectric conversion unit selected by the selector circuit 210 so that avalanche multiplication may occur. When photoelectric conversion due to an incident light is performed in a state where such a reverse bias electric potential is applied, the generated charges causes avalanche multiplication, and an avalanche current occurs.

Note that, when a reverse bias electric potential is supplied to a photoelectric conversion unit and when the electric potential difference between the anode and the cathode is larger than the breakdown voltage, the avalanche diode operates in a Geiger mode. A photodiode which detects a weak signal at a high speed in a single photon level using a Geiger mode operation is the SPAD.

Further, when the electric potential difference between the anode and the cathode of the photoelectric conversion unit is an electric potential difference that is above an electric potential difference at which charges generated in the photoelectric conversion unit cause avalanche multiplication and is below the breakdown voltage, the avalanche diode operates in a linear mode. An avalanche diode which performs photo-detection in a linear mode is referred to as an avalanche photodiode (APD). In the present embodiment, the photoelectric conversion unit may operate as any of the avalanche diodes. Note that an electric potential difference that causes avalanche multiplication is around 6 V or greater.

The cathode of the photoelectric conversion unit not selected by the selector circuit 210 is supplied with no electric potential. The electric potential difference between the anode and the cathode of the non-selected photoelectric conversion unit is sufficiently small, the charge generated by the incident light does not flow into the photoelectric conversion unit, and thus no avalanche multiplication occurs.

The control unit 202 is connected to the power source voltage line that supplies the electric potential VH that is higher than the electric potential VL and to either one of the photoelectric conversion units 201A and 201B. The control unit 202 has a function of replacing a change in an avalanche current generated in the photoelectric conversion unit into a voltage signal. Furthermore, the control unit 202 functions as a load circuit (quench circuit) at signal multiplication due to avalanche multiplication. Such a load circuit changes the voltage to be supplied to the photoelectric conversion unit to suppress avalanche multiplication. Such an operation is referred to as a quench operation. The control unit 202 may include a resistor element or an active quench circuit, for example. The active quench circuit is a circuit that detects an increase in the avalanche current to perform feedback control and thereby actively suppress avalanche multiplication. As described above, the control unit 202 and the selector circuit 210 function as a control unit that performs control so that avalanche multiplication occurs in either one of the two avalanche diodes.

The pixel signal processing unit 102 has a waveform shaping unit 203, a counter circuit 204, and a selector circuit 206. The waveform shaping unit 203 shapes a voltage change due to a signal of a single photon level and outputs a pulse signal. This pulse signal indicates incidence of a photon. An inverter circuit may be used for the waveform shaping unit 203 as illustrated in FIG. 5, for example. The waveform shaping unit 203 may be a circuit in which a plurality of inverters is connected in series, or another circuit may be used as long as the circuit has an effect of shaping a waveform.

A pulse signal output from the waveform shaping unit 203 is counted by the counter circuit 204. For example, an N-bit counter (N is a positive integer) is provided in the counter circuit 204, and the N-bit counter can count input pulse signal up to at most around the N-th power of 2 and hold the counted value. The signal obtained by counting is held in the counter circuit 204 as a signal indicating a result of detecting an incident light. Further, the counter circuit 204 is supplied with a control pulse pRES from the vertical scanning circuit 103 via the drive line 207. The counter circuit 204 resets the held signal in response to the control pulse pRES being input.

The selector circuit 206 is supplied with a control pulse pSEL from the vertical scanning circuit 103 via a drive line 208. The selector circuit 206 switches electrical connection or disconnection between the counter circuit 204 and the signal line 107 based on the control pulse pSEL. For the selector circuit 206, a transistor, a buffer circuit, or the like that outputs a signal to the outside of a pixel may be used, for example.

When the pixel unit 106 has a configuration in which the plurality of pixels 100 is arranged in a matrix, a capturing operation may be any of a rolling shutter operation or a global electronic shutter operation. For example, the rolling shutter operation is realized by resetting counts obtained by the counter circuit 204 sequentially on a row basis and outputting the signals held in the counter circuit 204 sequentially on a row basis.

Further, the global electronic shutter operation is realized by simultaneously resetting counts obtained by the counter circuit 204 on all the pixel rows and outputting signals held in the counter circuit 204 sequentially on a row basis. Note that, when the global electronic shutter operation is applied, it is desirable to provide a switch unit such as a switch so as to be able to switch whether or not to perform counting by the counter circuit 204.

Figure 6:
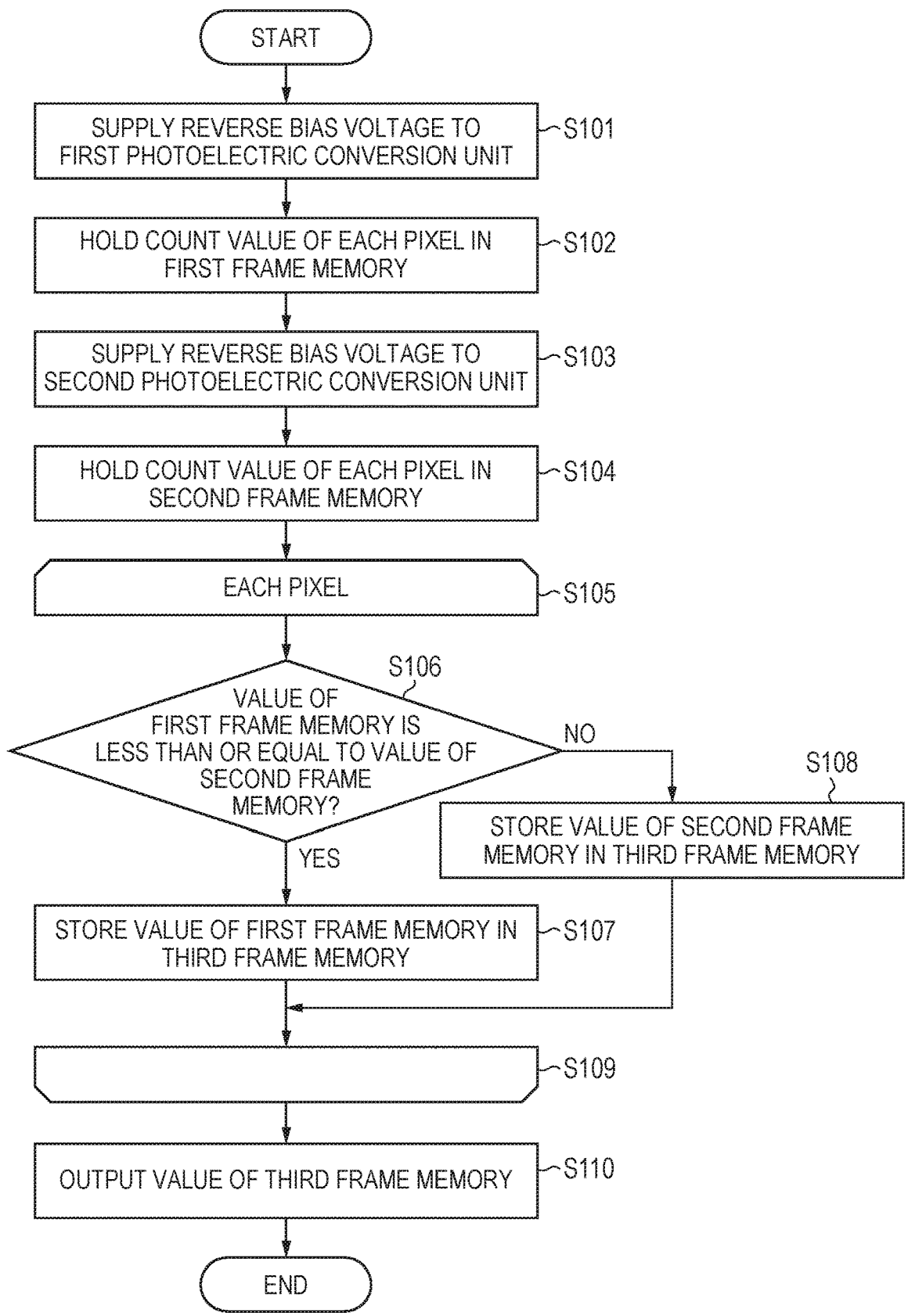
FIG. 6 is a flowchart illustrating control and signal processing methods of the photoelectric conversion device according to the second embodiment.
Figure 7:
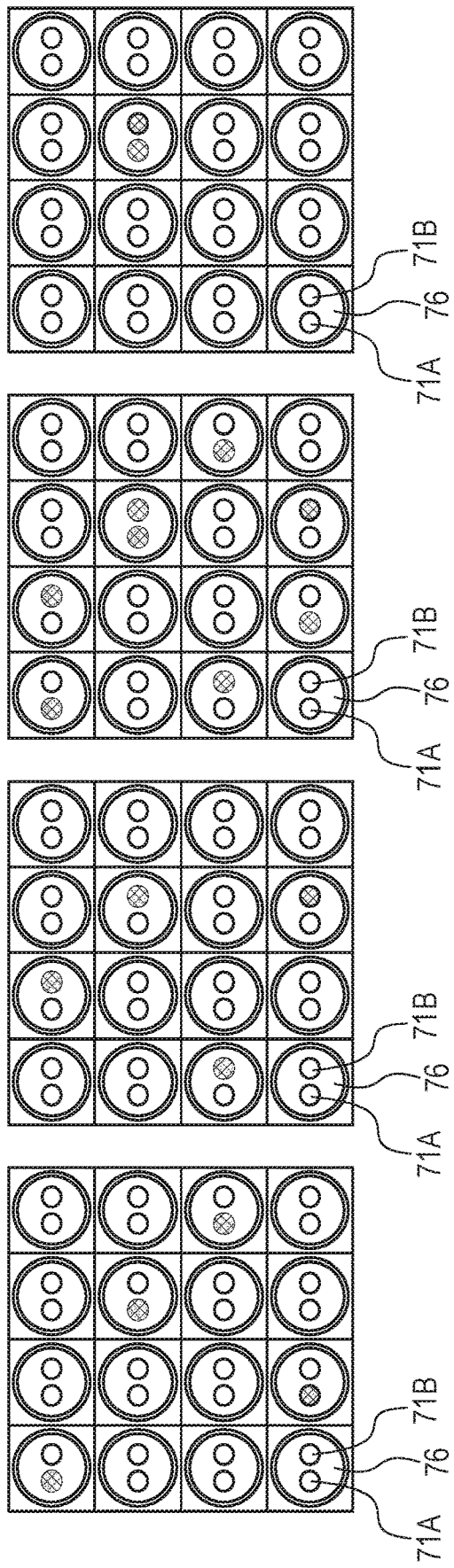
FIG. 7A, FIG. 7B, FIG. 7C, and FIG. 7D are schematic diagrams illustrating a mechanism in more detail by which an image signal having a smaller noise current is obtained.

FIG. 6 is a flowchart illustrating a control method and a signal processing method of the photoelectric conversion device 1010 according to the present embodiment. All or a part of the process of FIG. 6 may be based on control by a control device provided to an external apparatus such as an imaging system on which the photoelectric conversion device 1010 is mounted or may be based on control by a control device provided inside the photoelectric conversion device 1010. The control method and the signal processing method of the photoelectric conversion device 1010 will be described in accordance with FIG. 6.

In step S101, the selector circuit 210 is configured to connect the cathode of the photoelectric conversion unit 201A to the control unit 202 and disconnect the cathode of the photoelectric conversion unit 201B from the control unit 202. Thereby, the photoelectric conversion unit 201A enters a state where avalanche multiplication may occur.

In step S102, the photoelectric conversion device 1010 performs capturing based on an incident light to the pixel unit 106. In response to this capturing, a count value in accordance with the incident light from each pixel 100 of the pixel unit 106 is output. Here, the capturing condition in step S102 is a capturing condition used for normal capturing such that an external light enters the pixel unit 106. The capturing condition used for normal capturing is a condition such that, when the photoelectric conversion device 1010 is mounted on a digital still camera, the shutter is opened, and an incident light is taken in the pixel unit 106, for example. That is, the capturing condition used for normal capturing is not a capturing condition in which no incident light is taken, such as capturing with the shutter closed.

The count value of each pixel is then held in the first frame memory of the plurality of frame memories. Here, the plurality of frame memories is memories that can store a plurality of image data and may be a storage device provided inside the photoelectric conversion device 1010 or may be a storage device provided in an imaging system or the like outside the photoelectric conversion device 1010. This storage device is controlled by a processor provided in the photoelectric conversion device 1010, the imaging system, or the like in which the storage device is provided.

In step S103, the selector circuit 210 is configured to connect the cathode of the photoelectric conversion unit 201B to the control unit 202 and disconnect the cathode of the photoelectric conversion unit 201A from the control unit 202. Thereby, the photoelectric conversion unit 201B enters a state where avalanche multiplication may occur.

In step S104, the photoelectric conversion device 1010 performs capturing based on an incident light to the pixel unit 106. The capturing condition at this time is a capturing condition used for normal capturing in the same manner as in step S102. The count value of each pixel is then held in the second frame memory of the plurality of frame memories.

The loop process from step S105 to step S109 corresponds to processes sequentially performed by reading out corresponding data for each pixel 100 of the pixel unit 106. That is, when the number of pixels 100 is N, the total N times of processes from the first pixel 100 to the N-th pixel 100 are performed. These processes are performed by a processor that controls a storage device forming a plurality of frame memories. Such a processor may be provided inside the photoelectric conversion device 1010 or in an imaging system or the like outside the photoelectric conversion device 1010. Note that, when the processor is capable of parallel processing, some or all of the N times of processes may be simultaneously performed.

In step S106, the processor compares the value held in the first frame memory with the value held in the second frame memory. If the value held in the first frame memory is less than or equal to the value held in the second frame memory (step S106, YES), the process proceeds to step S107. If the value held in the first frame memory is greater than the value held in the second frame memory (step S106, NO), the process proceeds to step S108.

In step S107, the processor causes the value held in the first frame memory to be stored in the third frame memory of the plurality of frame memories. In step S108, the processor causes the value held in the second frame memory to be stored in the third frame memory of the plurality of frame memories. In such a way, the process from step S106 to step S108 is a process of causing the smaller one of the value held in the first frame memory and the value held in the second frame memory to be stored in the third frame memory used for external output.

In step S110, the processor outputs the value of the third frame memory as an image signal obtained by capturing. Note that, when the plurality of frame memories is storage devices outside the photoelectric conversion device 1010, this process is not essential.

As described above, an image signal based on the smaller value of a signal obtained by the photoelectric conversion unit 201A and a signal obtained by the photoelectric conversion unit 201B can be acquired. Thereby, an image signal selected as a signal less affected by a noise current can be obtained, and thus a good quality image can be obtained.

Note that the process from step S106 to step S108 may be a process such that, if the value held in the first frame memory is greater than the value held in the second frame memory, the first frame memory is overwritten by the value held in the second frame memory. In such a case, the third frame memory is unnecessary.

FIG. 7A to FIG. 7D are schematic diagrams illustrating the mechanism in more detail by which an image signal less affected by a noise current is obtained in accordance with the process illustrated in FIG. 6. FIG. 7A to FIG. 7D are schematic plane views of avalanche diodes at the first depth X when 16 pixels 100 are arranged in four rows by four columns.

As with FIG. 2A, each pixel 100 includes the first semiconductor regions 71A and 71B and the second semiconductor region 76 of the first conductivity type. Each hatching provided to the first semiconductor regions 71A and 71B indicates that a heavy metal is included nearby, which corresponds to an avalanche diode with a large noise current. FIG. 7A illustrates that the first semiconductor regions 71A of the pixels 100 each including a heavy metal near the first semiconductor region 71A are hatched. FIG. 7B illustrates that the first semiconductor regions 71B of the pixels 100 each including a heavy metal near the first semiconductor region 71B are hatched. FIG. 7C illustrates that the first semiconductor regions 71A and 71B of the pixels 100 each including a heavy metal near at least one of the first semiconductor regions 71A and 71B are hatched. FIG. 7D illustrates that the first semiconductor regions 71A and 71B of only the pixels 100 each including a heavy metal near both of the first semiconductor regions 71A and 71B are hatched. Note that the number and the arrangement of the pixels 100 including a heavy metal in FIG. 7A to FIG. 7D are mere examples for better understanding of the effect and advantage of the present embodiment, which does not illustrate a mixture distribution of a heavy metal occurring in the actual manufacturing process.

With reference to FIG. 7C, the number of pixels 100 including at least one avalanche diode having a heavy metal nearby is 7 out of the 16 pixels 100. That is, 7 pixels 100 out of 16 pixels may cause deterioration of quality of an image signal.

The value held in the first frame memory is based on a signal output from the first avalanche diode corresponding to the first semiconductor region 71A. Therefore, as illustrated in FIG. 7A, for the value held in the first frame memory, 4 pixels out of 16 pixels may cause deterioration of quality of an image signal.

Further, the value held in the second frame memory is based on a signal output from the second avalanche diode corresponding to the first semiconductor region 71B. Therefore, as illustrated in FIG. 7B, for the value held in the second frame memory, 4 pixels out of 16 pixels may cause deterioration of quality of an image signal.

Since the first semiconductor region 71A and the first semiconductor region 71B have the same arrangement and layout, when the distribution of heavy metals is even in the semiconductor substrate 15, the two avalanche diodes have the same probability of causing a large noise current.

In accordance with the process illustrated in FIG. 6, the smaller one of the count values in the first frame memory and the second frame memory has been selected in the third frame memory. Therefore, with respect to the value held in the third frame memory, only one pixel out of 16 pixels may cause a reduction in quality of an image signal, as illustrated in FIG. 7D. That is, because the smaller one of the count values in the first frame memory and the second frame memory is selected for the value held in the third frame memory, the occurrence frequency of quality reduction of an image signal due to a heavy metal is reduced.

Figure 8:
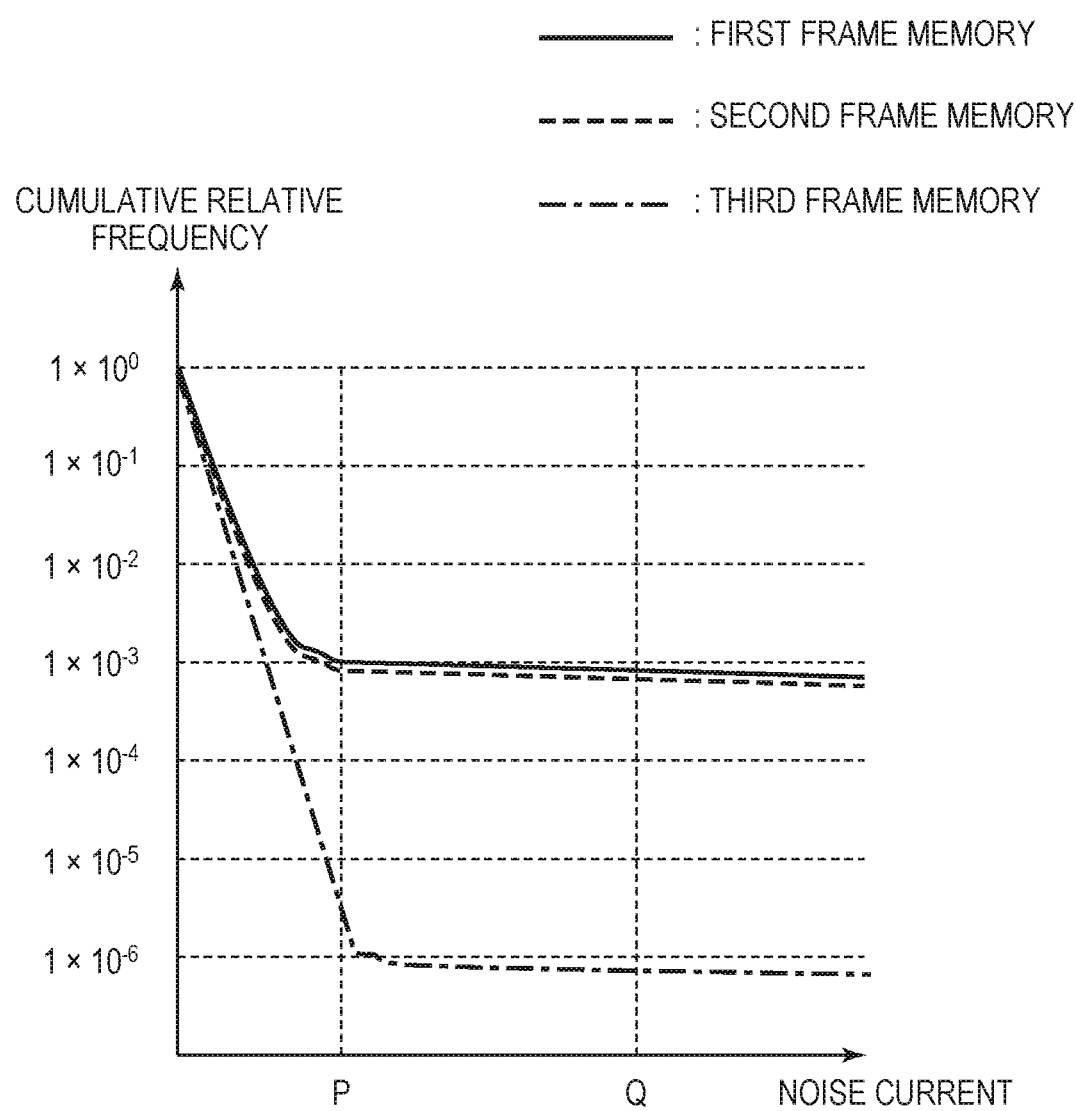
FIG. 8 is a graph illustrating a cumulative relative frequency of a noise current in the second embodiment.

FIG. 8 is a graph illustrating a cumulative relative frequency of a noise current value for the signal output from multiple pixels 100 including the avalanche diodes according to the present embodiment. The cumulative relative frequency in this graph is obtained by cumulating frequencies of a plurality of acquired signals in descending order of noise current value and dividing the cumulated frequencies by the number of all the signals to be normalized. In FIG. 8, graphs of the values held in the first, second, and third frame memories are layered and displayed. Further, in FIG. 8, the noise current whose value is below the level P is due to a diffusion current. Further, the noise current near the level Q is due to a noise current caused by a heavy metal or the like.

As described with reference to FIG. 7A to FIG. 7D, the value held in the third frame memory is the one resulted by selecting the smaller one of the count values in the first frame memory and the second frame memory. The probability that a value affected by a noise current due to a heavy metal is held in both the first frame memory and the second frame memory is the product of a probability that a value affected by a noise current due to a heavy metal is held in the first frame memory and a probability that a value affected by a noise current due to a heavy metal is held in the second frame memory. Therefore, the cumulative relative frequency of the third frame memory at the level Q is the product of cumulative relative frequencies of the first and second frame memories. Therefore, when the occurrence probability of a noise current due to a heavy metal is the same in the two avalanche diodes, the cumulative relative frequency of the third frame memory will be the square of the cumulative relative frequency of the first frame memory. Therefore, according to the present embodiment, it is possible to significantly reduce the probability that a signal affected by a noise current is included in an image signal.

Note that the number of avalanche diodes included in one pixel 100 may be three or greater. When the number thereof is n, the occurrence probability of a noise current will be the n-th power of the occurrence probability in the case of one avalanche diode, and thus influence of a noise current can be further reduced.

As described above, according to the present embodiment, a photoelectric conversion device that can reduce deterioration of signal quality due to a noise current can be provided as with the first embodiment.

Third Embodiment

A photoelectric conversion device according to a third embodiment will be described with reference to FIG. 9 to FIG. 11. A component having the same function as that of the first or second embodiment is labeled with the same reference, and detailed description thereof will be omitted.

Figure 9:
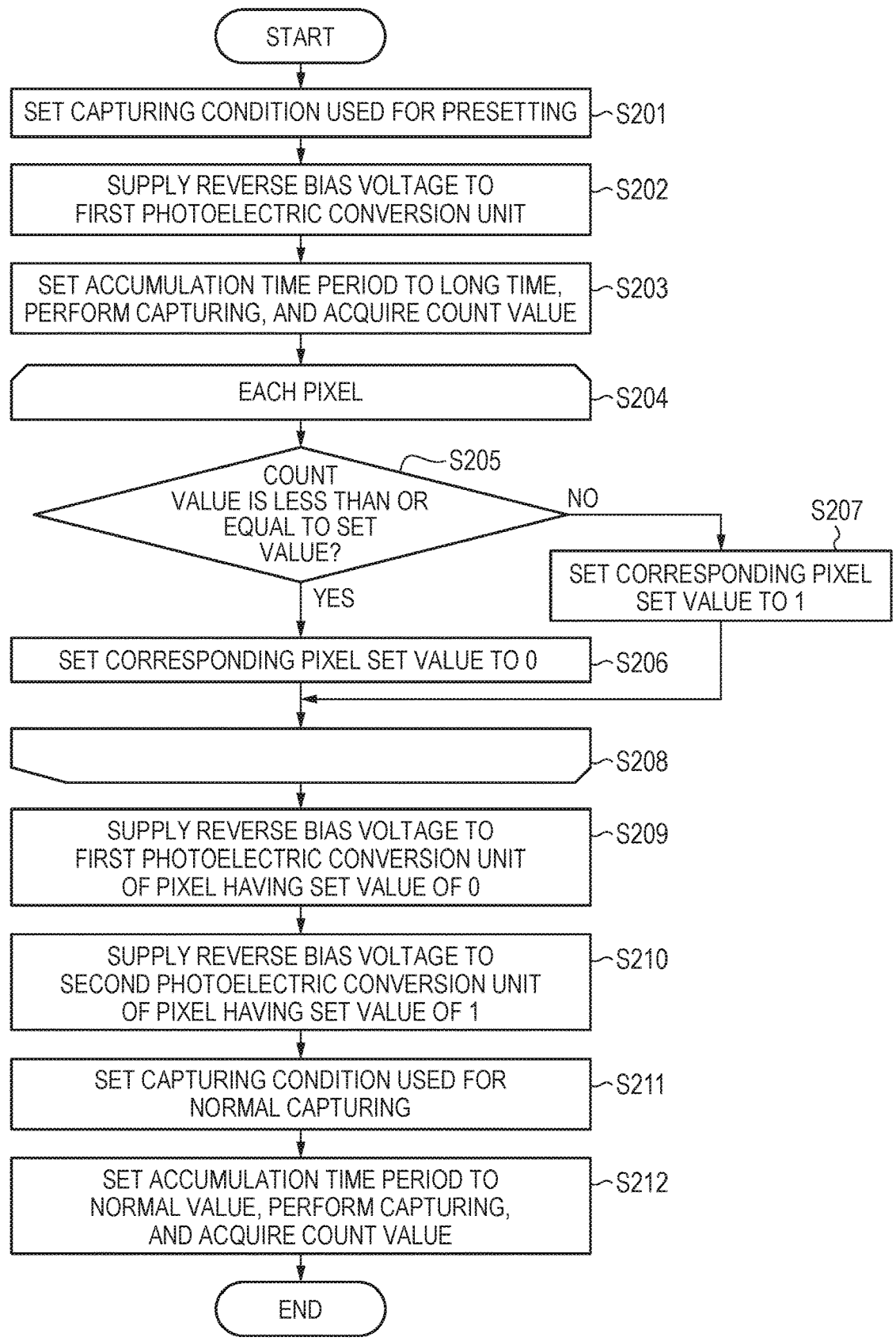
FIG. 9 is a flowchart illustrating control and signal processing methods of the photoelectric conversion device according to a third embodiment.
Figure 10:
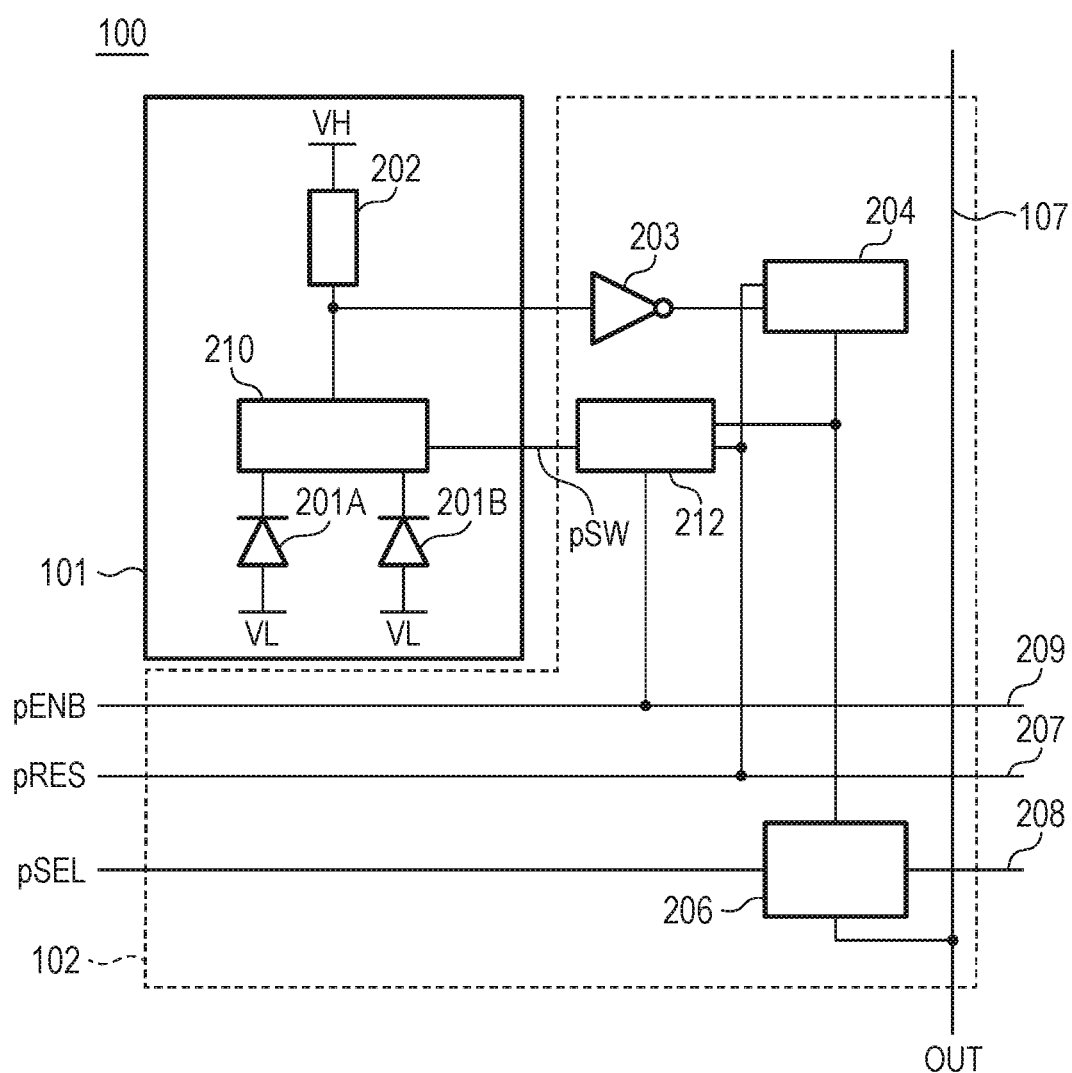
FIG. 10 is a block diagram of a pixel according to the third embodiment.

FIG. 9 is a flowchart illustrating a control method and a signal processing method of the photoelectric conversion device 1010 according to the present embodiment. All or a part of the process of FIG. 9 may be implemented by a circuit provided inside the photoelectric conversion device 1010. All or a part of the process of FIG. 9 may be based on control by a control device provided to an external apparatus such as an imaging system on which the photoelectric conversion device 1010 is mounted or may be based on control by a control device provided inside the photoelectric conversion device 1010. The control method and the signal processing method of the photoelectric conversion device 1010 will be described in accordance with FIG. 9.

In step S201, the photoelectric conversion device 1010 sets a capturing condition used for presetting. Here, the capturing condition used for presetting is a capturing condition in which no external light enters the pixel unit 106. This presetting is setting for acquiring a signal corresponding to a noise current. As a specific example, when the photoelectric conversion device 1010 is mounted in a digital still camera, a capturing condition used for presetting is realized by closing the shutter and preventing an incident light from being introduced to the pixel unit 106.

In step S202, the selector circuit 210 is configured to connect the cathode of the photoelectric conversion unit 201A to the control unit 202 and disconnect the cathode of the photoelectric conversion unit 201B from the control unit 202. Thereby, the photoelectric conversion unit 201A enters a state where avalanche multiplication may occur.

In step S203, the photoelectric conversion device 1010 performs capturing based on an incident light to the pixel unit 106. In response to this capturing, a count value in accordance with the incident light from each pixel 100 of the pixel unit 106 is output from the counter circuit 204. In this process, the accumulation time period of the incident light is set to be longer than that at the capturing time for normal capturing. This is because the capturing for presetting is for acquiring a signal corresponding to a noise current and it is therefore desirable to acquire the signal by taking sufficiently long time for preventing erroneous determination due to disturbance. This accumulation time period may be around one second, for example.

The loop process from step S204 to step S208 corresponds to processes performed for each pixel 100 of the pixel unit 106. Some or all of the processes from step S204 to step S208 may be simultaneously performed or may be sequentially performed on a pixel 100 basis. For example, in a process using an SR latch described later, the processes from step S204 to step S208 may be performed in parallel for respective pixels 100.

In step S205, the photoelectric conversion device 1010 compares the count value output from the counter circuit 204 with a set value. If the count value is less than or equal to the set value (step S205, YES), the process proceeds to step S206. If the count value is greater than the set value (step S205, NO), the process proceeds to step S207.

In step S206, the memory device inside the photoelectric conversion device 1010 sets the set value of the corresponding pixel 100 to 0. In step S207, the memory device inside the photoelectric conversion device 1010 sets the set value of the corresponding pixel 100 to 1. Here, the memory device may be any device as long as it can store one-bit information for each pixel 100. In such a memory device, it is desirable that a logic value be stably held regardless of a holding period, and the SR latch circuit described later may be one example. Further, in the memory device, a nonvolatile memory may be used so that information is not lost even when the power source is shut off.

In step S209, for the pixel 100 having the set value of 0, the selector circuit 210 is configured to connect the cathode of the photoelectric conversion unit 201A to the control unit 202 and disconnect the cathode of the photoelectric conversion unit 201B from the control unit 202. Thereby, the photoelectric conversion unit 201A enters a state where avalanche multiplication may occur.

In step S210, for the pixel 100 having the set value of 1, the selector circuit 210 is configured to connect the cathode of the photoelectric conversion unit 201B to the control unit 202 and disconnect the cathode of the photoelectric conversion unit 201A from the control unit 202. Thereby, the photoelectric conversion unit 201B enters a state where avalanche multiplication may occur.

In step S211, the photoelectric conversion device 1010 performs setting of a capturing condition used for normal capturing. The capturing condition used for normal capturing is the same as that described in the second embodiment. In step S212, the photoelectric conversion device 1010 performs capturing at a setting of accumulation time period of a normal value in accordance with the capturing condition used for normal capturing and acquires a count value used as an image signal. Note that the capturing time of the normal value is shorter than a long capturing time period used for presetting.

As described above, an image signal selected as the signal less affected by a noise current can be obtained as with the second embodiment, and thus a good quality image can be obtained.

Note that, in step S202 of this process, instead of the photoelectric conversion unit 201A, the photoelectric conversion unit 201B may be caused to enter a state where avalanche multiplication may occur. In such a case, the correspondence of the set value and the photoelectric conversion unit in step S209 and step S210 will be opposite.

Next, an example of the circuit that may implement the process of FIG. 9 will be described with reference to FIG. 10 and FIG. 11. Note that each circuit of FIG. 10 and FIG. 11 is a mere example of a solution that may implement the process of the present embodiment and may take other forms as long as the process of FIG. 9 can be implemented. FIG. 10 is a block diagram illustrating the pixel 100 according to the present embodiment. The pixel signal processing unit 102 of the pixel 100 further has an output determination circuit 212 in addition to the components described in the second embodiment.

The output determination circuit 212 is a circuit that stores, as a set value, a determination result as to whether or not the count value exceeds a predetermined value at presetting and functions as a determination unit that outputs the determination result to the selector circuit 210. An output signal from the counter circuit 204 and control pulses pRES and pENB output from the vertical scanning circuit 103 are input to the output determination circuit 212. The control pulse pRES is input to the output determination circuit 212 via the drive line 207, and the control pulse pENB is input to the output determination circuit 212 via the drive line 209. A control pulse pSW that is the output signal of the output determination circuit 212 is input to the selector circuit 210. Note that the output signal from the counter circuit 204 input to the output determination circuit 212 may be a bit value that is a part of the digital value forming the count value.

The control pulse pENB is an enable signal used for enabling the output determination circuit 212. The output determination circuit 212 effectively accepts a signal input from the counter circuit 204 only when the value of the control pulse pENB is 1. When the value of the control pulse pENB is 0, the output determination circuit 212 continues to hold the previous state regardless of a signal from the counter circuit 204. For example, in the example of FIG. 9, the state of the output determination circuit 212 can be appropriately controlled by setting the value of the control pulse pENB to 1 at presetting to enable a change of the setting and setting the value of the control pulse pENB to 0 at normal capturing to disable a change of the setting.

The control pulse pRES is a signal that resets the output determination circuit 212. Reset of the output determination circuit 212 is desirably performed before presetting and may be performed before the process of step S202, for example. In the example illustrated in FIG. 10, the control pulse pRES used for reset of the counter circuit 204 is used commonly also for the output determination circuit 212, and thereby the timings of reset can be matched. However, this is not essential, and the counter circuit 204 and the output determination circuit 212 may be reset by control pulses that are different from each other.

Figure 11:
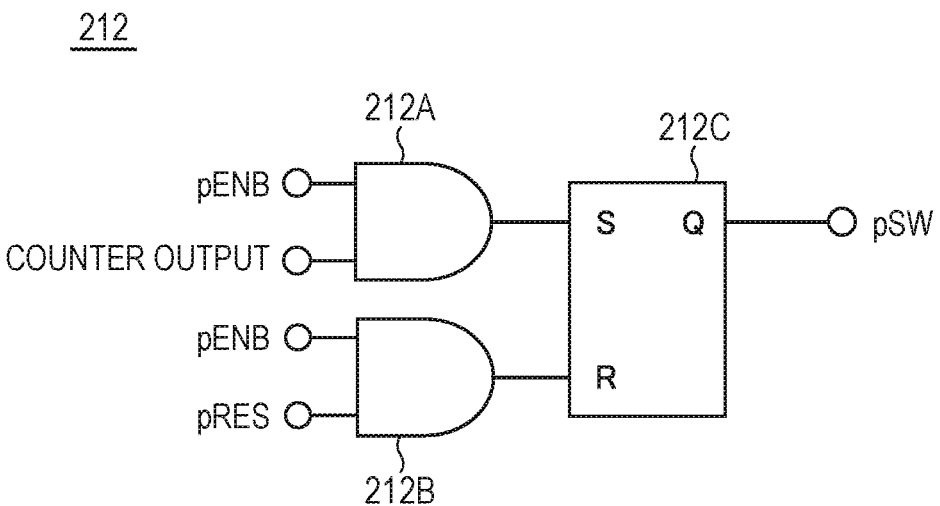
FIG. 11 is a block diagram of an output determination circuit according to the third embodiment.

FIG. 11 is a block diagram of the output determination circuit 212 according to the present embodiment. The output determination circuit 212 has AND circuits 212A and 212B and an SR latch circuit 212C. The control pulse pENB and the output signal from the counter circuit 204 are input to the AND circuit 212A. The AND circuit 212A outputs a logical product of the control pulse pENB and the output signal from the counter circuit 204. The output signal of the AND circuit 212A is input to the set terminal S of the SR latch circuit 212C. The control pulse pENB and the control pulse pRES are input to the AND circuit 212B. The AND circuit 212B outputs a logical product of the control pulse pENB and the control pulse pRES. The output signal of the AND circuit 212B is input to the reset terminal R of the SR latch circuit 212C. The control pulse pSW is output from the output terminal Q of the SR latch circuit 212C.

The signal output from the counter circuit 204 to the output determination circuit 212 may be an intermediate bit value of the counter circuit 204, for example. The intermediate bit value functions as a set value in step S205. When the counter circuit 204 is a 16-bit counter, the value of the eighth bit of the counter circuit 204 may be the intermediate bit value. In such a case, a value corresponding to 128 least significant bit (LSB) (10000000 in binary number) can be the set value in step S205.

In the process of presetting (in which the value of the control pulse pENB is 1), when 128 pulses based on optical charges are counted by the counter circuit 204, the output value of the counter circuit 204 is 1, and 1 is input to the set terminal S of the SR latch circuit 212C. Thereby, the output signal of the SR latch circuit 212C changes from 0 to 1. The output signal of the SR latch circuit 212C is the control pulse pSW and is used for selection of an avalanche diode to be connected by the selector circuit 210. As described above, a process of switching an avalanche diode to be connected when a larger noise current than a set value is detected under a capturing condition used for presetting is realized.

As described above, according to the present embodiment, a photoelectric conversion device that can reduce deterioration of signal quality due to a noise current can be provided as with the first embodiment and the second embodiment.

Fourth Embodiment

A photoelectric conversion device according to a fourth embodiment will be described with reference to FIG. 12 and FIG. 13. A component having the same function as that of the first to third embodiments is labeled with the same reference, and detailed description thereof will be omitted.

Figure 12:
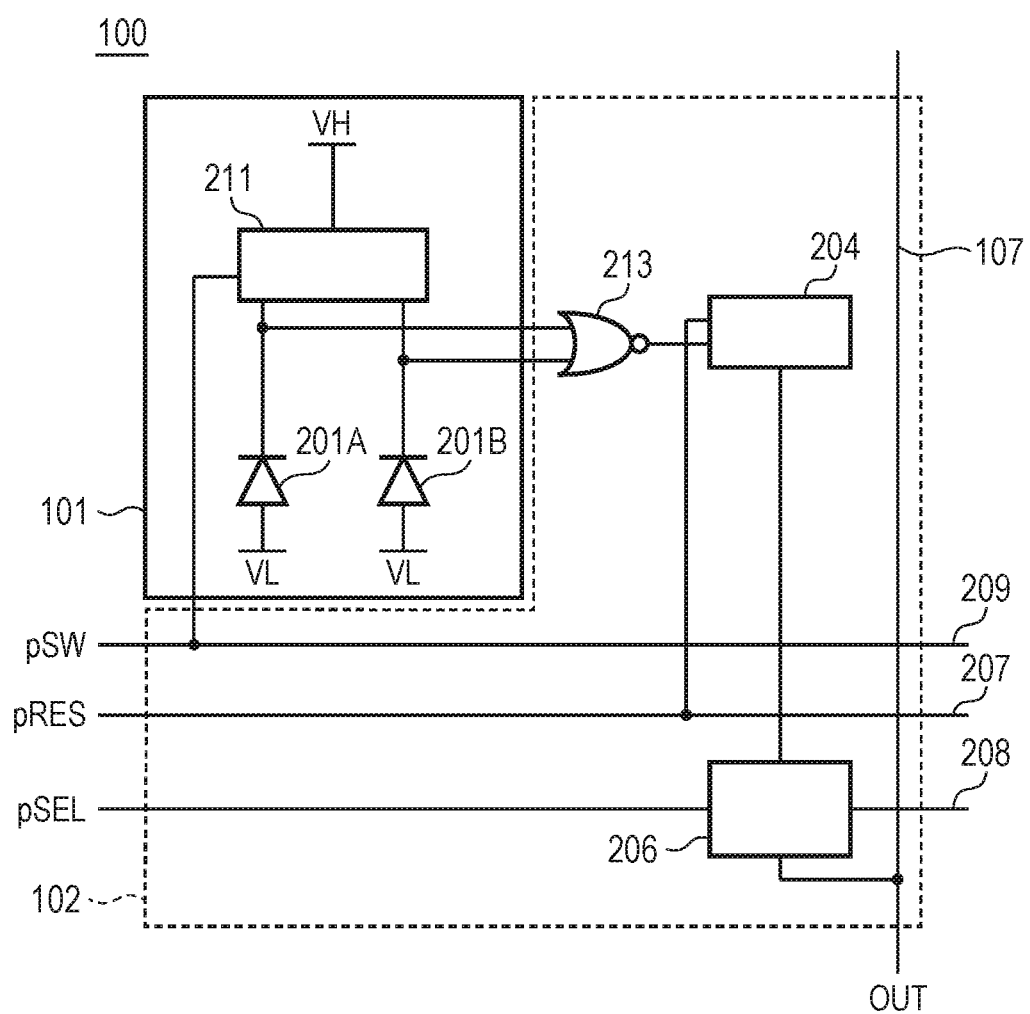
FIG. 12 is a block diagram of a pixel according to a fourth embodiment.

FIG. 12 is a block diagram of the pixel 100 according to the present embodiment. The photoelectric conversion element 101 of the present embodiment has a variable resistor circuit 211 instead of the control unit 202 and the selector circuit 210 of FIG. 5. Further, the pixel signal processing unit 102 of the present embodiment has a waveform shaping unit 213 formed of an NOR circuit instead of the waveform shaping unit 203 formed of the inverter of FIG. 5.

The variable resistor circuit 211 is provided between the power source voltage line that supplies the electric potential VH and the cathodes of the photoelectric conversion units 201A and 201B. The control pulse pSW is input to the variable resistor circuit 211 from the vertical scanning circuit 103 via the drive line 209. The variable resistor circuit 211 changes the resistance value between the power source voltage line and the photoelectric conversion unit 201A and the resistance value between the power source voltage line and the photoelectric conversion unit 201B in accordance with the signal level of the control pulse pSW.

One of these two resistance values is set to a large resistance value (first resistance value) so that the electric potential between the anode and the cathode is close to zero. This can prevent avalanche multiplication from occurring in the avalanche diode. The other of the two resistance values is set to a resistance value (second resistance value) adjusted so that avalanche multiplication occurs in the avalanche diode and an electric potential change in a current occurring due to avalanche multiplication causes a logic inversion in the waveform shaping unit 213.

It is possible to control the photoelectric conversion element 101 so as to generate avalanche multiplication only in the photoelectric conversion unit 201A by setting the resistance value between the power source voltage line and the photoelectric conversion unit 201A to the second resistance value and setting the resistance value between the power source voltage line and the photoelectric conversion unit 201B to the first resistance value. Further, it is possible to control the photoelectric conversion element 101 so as to generate avalanche multiplication only in the photoelectric conversion unit 201B by setting the resistance value between the power source voltage line and the photoelectric conversion unit 201A to the first resistance value and setting the resistance value between the power source voltage line and the photoelectric conversion unit 201B to the second resistance value. As described above, the variable resistor circuit 211 functions as a select unit that performs control so that avalanche multiplication occurs in either one of the two avalanche diodes.

Specifically, the variable resistor circuit 211 may be formed of an NMOS or PMOS. The NMOS or the PMOS can switch itself between an ON state in which the inversion layer (channel) between the source and the drain is formed in accordance with a gate electric potential and an OFF state in which the inversion layer is not formed. Further, NMOS or the PMOS can also change the size of the inversion layer, that is, the resistance value in accordance with a gate electric potential. Therefore, the NMOS or the PMOS may function as a variable resistor element that can switch two resistance values described above.

Figure 13:
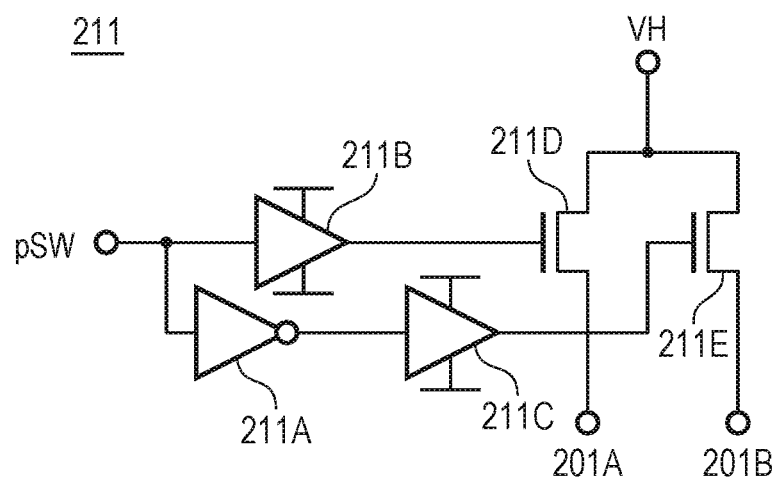
FIG. 13 is an equivalent circuit diagram of a variable resistor circuit according to the fourth embodiment.

FIG. 13 is one example of an equivalent circuit diagram of the variable resistor circuit 211 according to the present embodiment. The variable resistor circuit 211 includes an inverter 211A, input level converter circuits 211B and 211C, and variable resistor elements 211D and 211E. The variable resistor elements 211D and 211E are NMOSs, for example, but may be PMOSs. Each of the input level converter circuits 211B and 211C is a circuit that converts the level of the electric potential of the input control pulse pSW into a level suitable for control of the resistance value of the NMOS. Specifically, the input level converter circuits 211B and 211C convert the electric potential level so that, when the control pulse pSW is at the high level, the variable resistor element 211D is in the on-state and has the second resistance value and the variable resistor element 211E is in the off-state and has the first resistance value.

The control pulse pSW is directly input to the input level converter circuit 211B. The signal output from the input level converter circuit 211B is input to the gate of the variable resistor element 211D. The control pulse pSW inverted by the inverter 211A is input to the input level converter circuit 211C. The signal output from the input level converter circuit 211C is input to the gate of the variable resistance element 211E.

The drains of the variable resistance elements 211D and 211E are connected to the power source voltage line that supplies the electric potential VH. The source of the variable resistor element 211D is connected to the cathode of the photoelectric conversion unit 201A, and the source of the variable resistance element 211E is connected to the cathode of the photoelectric conversion unit 201B. With the above configuration, the variable resistor circuit 211 can change the resistance so that avalanche multiplication occurs in either one of the two avalanche diodes.

As described above, according to the present embodiment, a photoelectric conversion device that can reduce deterioration of signal quality due to a noise current can be provided as with the first embodiment to the third embodiment.

Fifth Embodiment

An imaging system according to a fifth embodiment will be described with reference to FIG. 14. The imaging system of the present embodiment has the photoelectric conversion device of any of the first embodiment to the fourth embodiment. The imaging system is an apparatus used for capturing a static image or a moving image, such as a digital still camera, a digital video camera, a digital camera used for a mobile phone, or the like.

Figure 14:
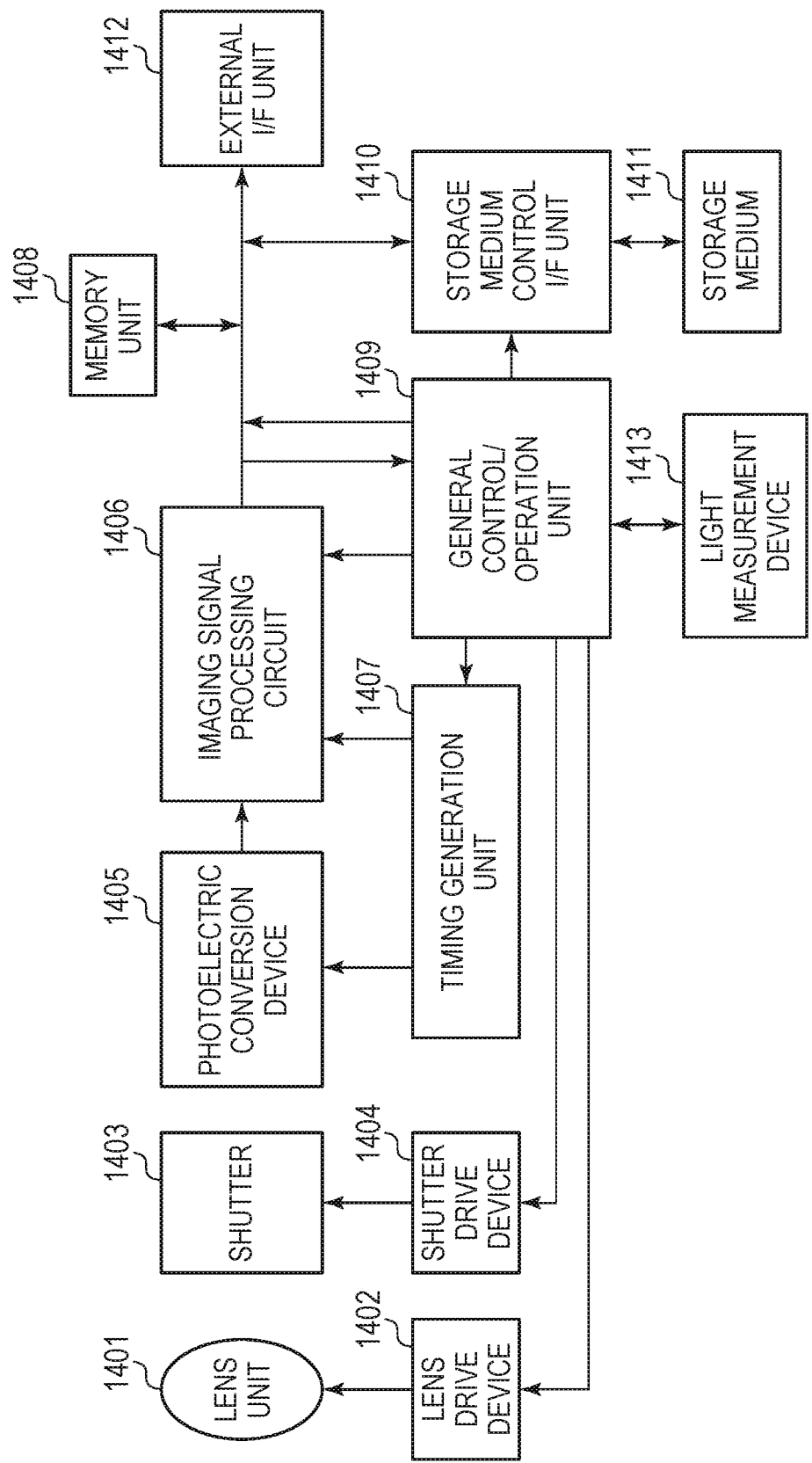
FIG. 14 is a block diagram of an imaging system according to a fifth embodiment.

FIG. 14 is a block diagram of an imaging system according to the fifth embodiment. The imaging system has a lens unit 1401, a lens drive device 1402, a shutter 1403, a shutter drive device 1404, a photoelectric conversion device 1405, an imaging signal processing circuit 1406, and a timing generation unit 1407. The imaging system further has a memory unit 1408, a general control/operation unit 1409, a storage medium control interface (I/F) unit 1410, a storage medium 1411, an external I/F unit 1412, and a light measurement device 1413.

The lens unit 1401 is a section that captures an optical image of a subject on the photoelectric conversion device 1405. The lens drive device 1402 is a device that drives the lens unit 1401. The lens drive device 1402 performs zoom control, focusing control, aperture control, or the like by driving the lens unit 1401. The shutter 1403 is an optical member for shielding of an incident light, and mechanical shutter may be used, for example. Further, the shutter 1403 may also have a function of an aperture. The shutter drive device 1404 performs control of opening or closing of the shutter 1403 or the like.

The photoelectric conversion device 1405 is the photoelectric conversion device of any of the first embodiment to the fourth embodiment and converts an optical image of a subject captured by the lens unit 1401 into an image signal to acquire the image signal. The imaging signal processing circuit 1406 is a circuit that performs various correction, data compression, or the like on an image signal output from the photoelectric conversion device 1405. The timing generation unit 1407 is a circuit that outputs various timing signals to the photoelectric conversion device 1405 and the imaging signal processing circuit 1406.

The general control/operation unit 1409 is a control circuit that performs various operation and control of the overall imaging system. The memory unit 1408 is a storage device used for temporarily storing image data output from the imaging signal processing circuit 1406. The storage medium control I/F unit 1410 is an interface used for performing storage or readout on the storage medium 1411. The storage medium 1411 is a removable storage medium such as a semiconductor memory and is used for storage or readout of image data. The external I/F unit 1412 is an interface used for externally providing various information, a captured image, or the like and may be a communication interface to another information processing device such as a computer or may be a user interface such as a display device.

Next, the operation at capturing when the imaging system is a digital still camera having a ranging function will be described. When the main power source of the imaging system is turned on, a power source used for control of the imaging system and a power source used for capturing that supplies power to the imaging signal processing circuit 1406 or the like are sequentially turned on.

Once a user presses a release button (not illustrated), the photoelectric conversion device 1405 acquires an image signal, and the general control/operation unit 1409 performs a ranging operation based on data of image signals and, based on the result, calculates the distance to a subject. The lens drive device 1402 then performs focus adjustment by a process of driving the lens unit 1401 based on the calculated distance and determining whether or not focusing is successful, and if focusing is not successful, again driving the lens unit 1401. The ranging operation may be performed in a ranging-dedicated device (not illustrated) other than the operation using an image signal acquired by the photoelectric conversion device 1405.

Once focusing is confirmed, the imaging system starts a capturing operation. After the end of the capturing operation, an image signal output from the photoelectric conversion device 1405 is processed in the imaging signal processing circuit 1406 and written to the memory unit 1408 under the control of the general control/operation unit 1409. The imaging signal processing circuit 1406 performs rearrangement, addition, or the like on data. The data written in the memory unit 1408 is stored in the storage medium 1411 via the storage medium control I/F unit 1410 under the control of the general control/operation unit 1409. Further, such data may be input to a computer or the like via the external I/F unit 1412. The computer can perform a process, such as edition of an image, on the data output from the imaging system.

The imaging system of the present embodiment has the photoelectric conversion device of any of the first to fourth embodiments. The photoelectric conversion devices of the first to fourth embodiments are configured to reduce deterioration of signal quality due to a noise current. Therefore, according to the present embodiment, an imaging system that may acquire an image with less noise can be provided.

Sixth Embodiment

Figure 15A:
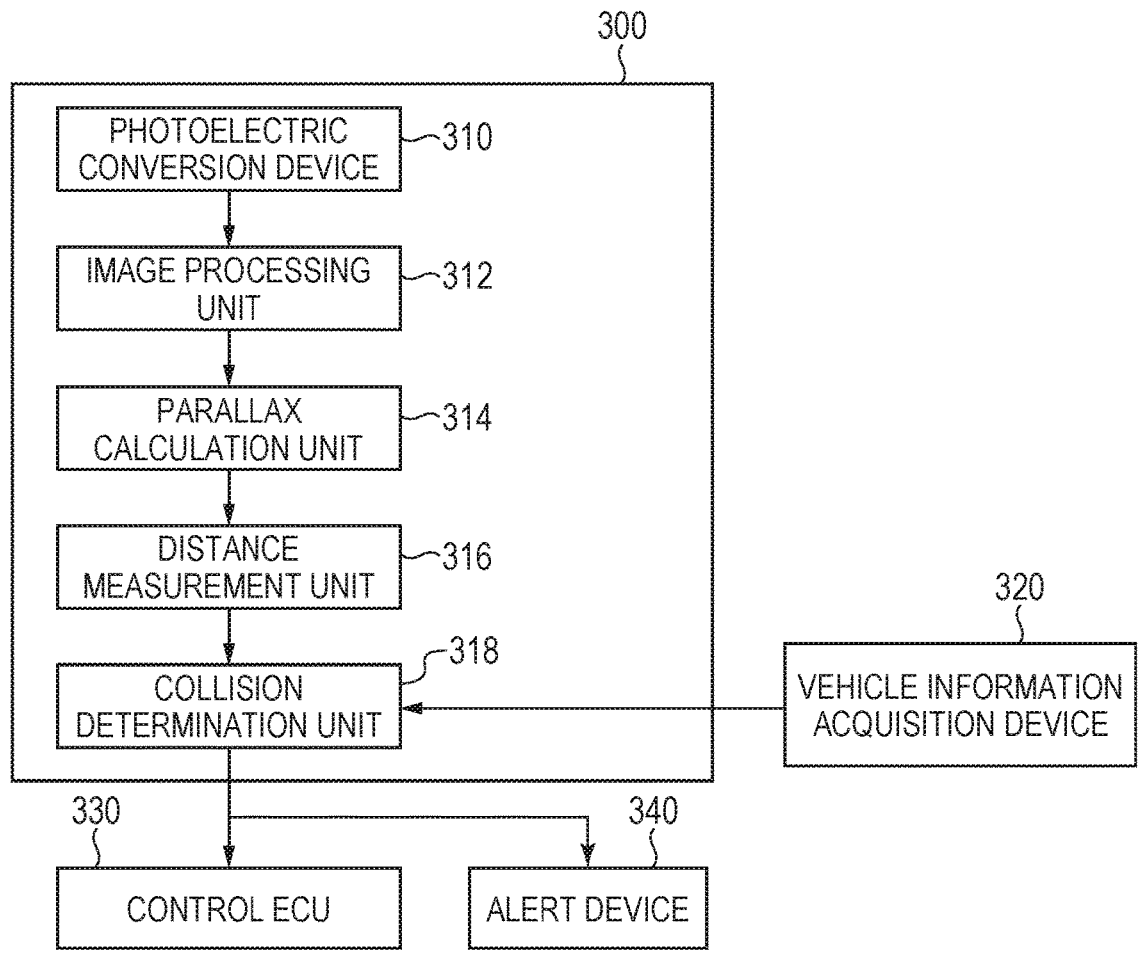
FIG. 15A and FIG. 15B are block diagrams of an imaging system and a mobile apparatus according to a sixth embodiment.
Figure 15B:
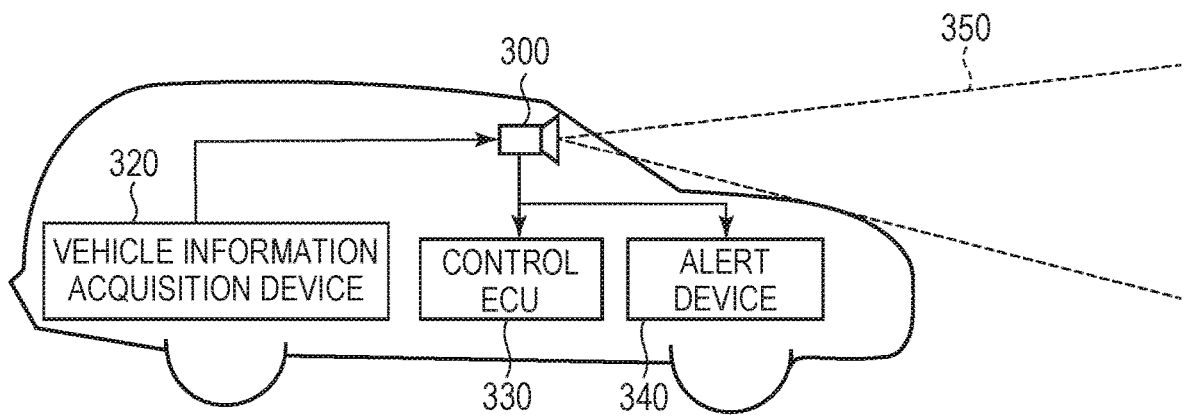

An imaging system and a mobile apparatus according to a sixth embodiment of the present invention will be described with reference to FIG. 15A and FIG. 15B. FIG. 15A and FIG. 15B are diagrams illustrating the configuration of the imaging system 300 and a mobile apparatus according to the present embodiment.

FIG. 15A illustrates an example of an imaging system 300 related to an on-vehicle camera. An imaging system 300 has a photoelectric conversion device 310. The photoelectric conversion device 310 of the present embodiment is the photoelectric conversion device described in any of the above first to fourth embodiments. The imaging system 300 has an image processing unit 312 that performs image processing on a plurality of image data acquired by the photoelectric conversion device 310 and a parallax calculation unit 314 that calculates a parallax (a phase difference of parallax images) from the plurality of image data acquired by the photoelectric conversion device 310. Further, the imaging system 300 has a distance measurement unit 316 that calculates a distance to the object based on the calculated parallax and a collision determination unit 318 that determines whether or not there is a collision possibility based on the calculated distance. Here, the parallax calculation unit 314 and the distance measurement unit 316 are an example of a distance information acquisition device that acquires distance information on the distance to the object. That is, the distance information is information on a parallax, a defocus amount, a distance to an object, or the like. The collision determination unit 318 may use any of the distance information to determine the collision possibility. The distance information acquisition device may be implemented by dedicatedly designed hardware or may be implemented by a software module. Further, the distance information acquisition unit may be implemented by a Field Programmable Gate Array (FPGA), an Application Specific Integrated Circuit (ASIC), or the like or may be implemented by a combination thereof.

The imaging system 300 is connected to the vehicle information acquisition device 320 and can acquire vehicle information such as a vehicle speed, a yaw rate, a steering angle, or the like. Further, the imaging system 300 is connected to a control ECU 330, which is a control device that outputs a control signal for causing a vehicle to generate braking force based on a determination result by the collision determination unit 318. Further, the imaging system 300 is also connected to an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 15B illustrates an arrangement example of the imaging system 300 when a front area of a vehicle (a capturing area 350) is captured. The vehicle information acquisition device 320 transmits an instruction to the imaging system 300 or the photoelectric conversion device 310. Such a configuration can further improve the ranging accuracy.

Although the example of control for avoiding a collision to another vehicle has been described above, the embodiment is applicable to automatic driving control for following another vehicle, automatic driving control for not going out of a traffic lane, or the like. Furthermore, the imaging system 300 is not limited to a vehicle such as the subject vehicle and can be applied to a mobile apparatus (moving apparatus) such as a ship, an airplane, or an industrial robot, for example. In addition, the imaging system can be widely applied to a device which utilizes object recognition, such as an intelligent transportation system (ITS), without being limited to mobile apparatuses.

Modified Embodiments

The present invention is not limited to the embodiments described above, and various modifications are possible. For example, an example in which a part of the configuration of any of the embodiments is added to another embodiment or an example in which a part of the configuration of any of the embodiments is replaced with a part of the configuration of another embodiment is also one of the embodiments of the present invention.

Further, the device or the system illustrated in the above fifth and sixth embodiments is a configuration example of a device or a system to which the photoelectric conversion device of the present invention may be applied, and a device or a system to which the photoelectric conversion device of the present invention can be applied is not limited to the configuration illustrated in FIG. 14, FIG. 15A, or FIG. 15B.

While the pixel 101 including two photoelectric conversion units 201A and 201B is illustrated as an example in some of the embodiments described above, the number of photoelectric conversion units may be greater than two. That is, in some of the embodiments described above, such a rephrase is possible that a plurality of photoelectric conversion units has only a first group including the first avalanche diode and a second group including the second avalanche diode. The number of avalanche diodes included in each of the first group and the second group may be one or may be two or greater. In such a case, the select unit performs control so that an active state and an inactive state are exclusively selected between the first group of photoelectric conversion units and the second group of photoelectric conversion units. That is, the select unit controls the second group to be inactivated in a first case of controlling the first group to be activated, and controls the first group to be deactivated in a second case of controlling the second group to be activated. In the above control, there is no photoelectric conversion unit (avalanche diode) that is in an active state in both the first case and the second case. Further, it is possible to perform control so that the number of photoelectric conversion units in the active state is the same between the first case and the second case. Further, in the example in which the active state and the inactive state are controlled in accordance with whether or not the noise exceeds a predetermined value as illustrated in FIG. 9, the select unit controls the first group to be inactivated and the second group to be activated when the noise included in a signal output from the first group exceeds the predetermined value.

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-236388, filed Dec. 18, 2018, and Japanese Patent Application No. 2019-217293, filed Nov. 29, 2019, which are hereby incorporated by reference herein in their entirety.

What is claimed is:

1. A photoelectric conversion device comprising:
   at least one pixel including a plurality of photoelectric conversion units; and
   a select unit configured to control each of the plurality of photoelectric conversion units to be in an active state or an inactive state,
   wherein the select unit includes a quench circuit shared by the plurality of photoelectric conversion units and a selector circuit arranged between the plurality of photoelectric conversion units and the quench circuit,
   wherein the plurality of photoelectric conversion units has a first group including a first avalanche diode and a second group including a second avalanche diode,
   wherein the select unit controls the second group to be in the inactive state in a first case of controlling the first group to be in the active state, and the select unit controls the first group to be in the inactive state in a second case of controlling the second group to be in the active state, and
   wherein the pixel includes a well region surrounded by an element isolation region.

2. The photoelectric conversion device according to claim 1, wherein the select unit performs control so that avalanche multiplication occurs in either one of the first avalanche diode and the second avalanche diode.

3. The photoelectric conversion device according to claim 2, wherein the select unit controls a bias voltage supplied to at least one of the first avalanche diode and the second avalanche diode so that avalanche multiplication occurs in either one of the first avalanche diode and the second avalanche diode.

4. The photoelectric conversion device according to claim 3, wherein the select unit controls the bias voltage so that a reverse bias voltage is supplied to one of the first avalanche diode and the second avalanche diode.

5. The photoelectric conversion device according to claim 4, wherein the select unit controls the bias voltage so that the other of the first avalanche diode and the second avalanche diode is in a floating state or a zero bias state.

6. The photoelectric conversion device according to claim 1,
   wherein the select unit includes a variable resistor element, and
   wherein the variable resistor element is arranged between an electric potential line that provides a predetermined electric potential and at least one of the first avalanche diode and the second avalanche diode.

7. The photoelectric conversion device according to claim 1 further comprising:
   a first frame memory configured to store an output value when avalanche multiplication occurs in the first avalanche diode; and
   a second frame memory configured to store an output value when avalanche multiplication occurs in the second avalanche diode,
   wherein the smaller one of a value stored in the first frame memory and a value stored in the second frame memory is output as an output value of the pixel.

8. The photoelectric conversion device according to claim 1 further comprising:
   a first frame memory configured to store an output value when avalanche multiplication occurs in the first avalanche diode;
   a second frame memory configured to store an output value when avalanche multiplication occurs in the second avalanche diode; and
   a third frame memory configured to store the smaller one of a value stored in the first frame memory and a value stored in the second frame memory.

9. The photoelectric conversion device according to claim 1 further comprising a determination unit configured to output a control signal indicating whether or not an output value of either one of the first avalanche diode and the second avalanche diode exceeds a predetermined value,
   wherein the select unit performs control so as to select an avalanche diode in which avalanche multiplication occurs based on the output of the determination unit.

10. The photoelectric conversion device according to claim 9, wherein the determination unit generates the control signal based on an output value of the first avalanche diode or the second avalanche diode acquired under a condition where no light enters the pixel.

11. The photoelectric conversion device according to claim 1,
    wherein the photoelectric conversion device comprises a plurality of pixels and a plurality of microlenses, and
    wherein the plurality of microlenses are arranged to the plurality of pixels such that one microlens corresponds to one pixel.

12. The photoelectric conversion device according to claim 1, wherein the pixel has no photoelectric conversion unit which is in the active state in both the first case and the second case.

13. The photoelectric conversion device according to claim 1, wherein both of the first avalanche diode and the second avalanche diode are formed in the same well region.

14. An imaging system comprising:
the photoelectric conversion device according to claim 1; and
a signal processing unit configured to process a signal output from the photoelectric conversion device.

15. A mobile apparatus comprising:
the photoelectric conversion device according to claim 1;
a distance information acquisition device configured to acquire distance information on a distance to an object, from a parallax image based on signals from the photoelectric conversion device; and
a control device configured to control the mobile apparatus based on the distance information.

16. A photoelectric conversion device comprising:
a pixel including a plurality of photoelectric conversion units; and
a select unit configured to control each of the plurality of photoelectric conversion units to be in an active state or an inactive state,
wherein the select unit includes a quench circuit shared by the plurality of photoelectric conversion units and a selector circuit arranged between the plurality of photoelectric conversion units and the quench circuit,
wherein the plurality of photoelectric conversion units has a first group including a first avalanche diode and a second group including a second avalanche diode,
wherein the select unit controls the first group to be in the inactive state and controls the second group to be in the active state when noise included in a signal output from the first group exceeds a predetermined value, and
wherein the pixel includes a well region surrounded by an element isolation region.

17. The photoelectric conversion device according to claim 16, wherein both of the first avalanche diode and the second avalanche diode are formed in the same well region.

18. A photoelectric conversion device comprising:
a pixel including a plurality of photoelectric conversion units; and
a select unit configured to control each of the plurality of photoelectric conversion units to be in an active state or an inactive state,
wherein the select unit includes a quench circuit shared by the plurality of photoelectric conversion units and a selector circuit arranged between the plurality of photoelectric conversion units and the quench circuit,
wherein the plurality of photoelectric conversion units have a first group including a first avalanche diode and a second group including a second avalanche diode,
wherein the select unit controls the second group to be in the inactive state in a first case of controlling the first group to be in the active state, and the select unit controls the first group to be in the inactive state in a second case of controlling the second group to be in the active state,
wherein in the pixel, the number of photoelectric conversion units in the active state is the same between the first case and the second case, and
wherein the pixel includes a well region surrounded by an element isolation region.

19. The photoelectric conversion device according to claim 18, wherein both of the first avalanche diode and the second avalanche diode are formed in the same well region.

* * * * *